(12) United States Patent
Abe et al.

(10) Patent No.: US 10,743,386 B2
(45) Date of Patent: Aug. 11, 2020

(54) DISPLAY DEVICE AND ELECTRONIC APPARATUS

(71) Applicant: JOLED INC., Tokyo (JP)

(72) Inventors: Kaoru Abe, Tokyo (JP); Kazuma Teramoto, Tokyo (JP); Toshiaki Imai, Tokyo (JP); Jiro Yamada, Tokyo (JP); Takahide Ishii, Tokyo (JP); Hideki Kobayashi, Tokyo (JP)

(73) Assignee: JOLED INC., Tokyo (JP)

( * ) Notice: Subject to any disclaimer, the term of this patent is extended or adjusted under 35 U.S.C. 154(b) by 447 days.

(21) Appl. No.: 15/590,156

(22) Filed: May 9, 2017

(65) Prior Publication Data

US 2017/0245342 A1    Aug. 24, 2017

Related U.S. Application Data

(63) Continuation of application No. PCT/JP2015/064346, filed on May 19, 2015.

(30) Foreign Application Priority Data

Dec. 9, 2014    (JP) ................................ 2014-248980

(51) Int. Cl.
  *H05B 45/00*    (2020.01)
  *G09G 3/3225*   (2016.01)
  (Continued)

(52) U.S. Cl.
  CPC ........... *H05B 45/60* (2020.01); *G09G 3/3225* (2013.01); *H01L 27/32* (2013.01); *H01L 27/326* (2013.01);
  (Continued)

(58) Field of Classification Search
  CPC .. H05B 33/0896; G09G 3/3225; H01L 27/32; H01L 27/3244; H01L 27/326; H01L 51/50; H01L 51/5271
  (Continued)

(56) References Cited

U.S. PATENT DOCUMENTS 8,115,376 B2 *  2/2012  Fujioka ............... H01L 51/5212
                                                        313/498
8,604,463 B2 * 12/2013  Kwon .................. H01L 27/3276
                                                        257/40
(Continued)

FOREIGN PATENT DOCUMENTS

JP    2004-119197 A    4/2004
JP    2012-14859 A     1/2012
JP    2014-207105 A    10/2014

OTHER PUBLICATIONS

International Search Report in PCT/JP2015/064346, dated Jul. 21, 2015.

*Primary Examiner* — Bryon T Gyllstrom
(74) *Attorney, Agent, or Firm* — Hauptman Ham, LLP

(57) ABSTRACT

A display device includes a pixel including a plurality of sub-pixels. Each of the plurality of sub-pixels includes: a light-emission region; and a non-light-emission region other than the light-emission region. The light-emission region includes one or more effective light-emitting parts in which a first electrode, a light emitting layer, and a second electrode are stacked in order, and a light guide provided on side of the one or more effective light-emitting parts on which light is extracted.

19 Claims, 23 Drawing Sheets

(51) Int. Cl.
    *H01L 51/52*        (2006.01)
    *H01L 51/50*        (2006.01)
    *H01L 27/32*        (2006.01)
(52) U.S. Cl.
    CPC .......... *H01L 27/3244* (2013.01); *H01L 51/50* (2013.01); *H01L 51/5271* (2013.01); *G09G 2300/0426* (2013.01); *G09G 2300/0452* (2013.01); *G09G 2300/0465* (2013.01); *H01L 27/3206* (2013.01); *H01L 27/3211* (2013.01); *H01L 51/5253* (2013.01)
(58) Field of Classification Search
    USPC ........................................................ 362/618
    See application file for complete search history.

(56)              References Cited

U.S. PATENT DOCUMENTS

| | | | |
|---|---|---|---|
| 8,860,303 B2* | 10/2014 | Kim ................... | H01L 27/3246 313/504 |
| 8,916,852 B2* | 12/2014 | Kim ................... | H01L 51/5237 257/40 |
| 9,130,190 B2* | 9/2015 | Sagawa ............... | H01L 51/5221 |
| 9,424,771 B2* | 8/2016 | Gong .................. | G09G 3/3208 |
| 9,710,090 B2* | 7/2017 | Choi .................... | G06F 3/0412 |
| 10,199,606 B2* | 2/2019 | Teramoto ........... | H01L 27/3211 |
| 2007/0228368 A1* | 10/2007 | Takahashi ........... | H01L 51/5096 257/40 |
| 2014/0306200 A1 | 10/2014 | Jinta et al. | |
| 2014/0346459 A1* | 11/2014 | Song .................. | H01L 51/5228 257/40 |

* cited by examiner

DISPLAY DEVICE AND ELECTRONIC APPARATUS

CROSS REFERENCE TO RELATED APPLICATIONS

This is a continuation of International Application No. PCT/JP2015/064346, filed on May 19, 2015, which claims the benefit of Japanese Priority Patent Application JP2014-248980, filed on Dec. 9, 2014, the entire contents of all of which are incorporated herein by reference.

BACKGROUND

The disclosure relates to a display device suitable for, for example, an organic EL (electroluminescence) display device, and an electronic apparatus including the display device.

An organic EL display device is utilized in various electronic apparatuses such as a television device, an electronic viewfinder, and a mobile terminal. Moreover, utilization of the organic EL display device makes it possible to constitute a transmission, i.e., see-through display device. The see-through display device has background transparency, and is able to display an image in a superimposed or merged relation to the background. The background transparency refers to a state in which a background of an image is seen through the image. In the see-through display device, generally, transparent conductive films are used for its electrodes, to obtain the background transparency. Meanwhile, for example, Japanese Unexamined Patent Application Publication No. 2012-14859 describes a see-through display device in which a non-translucent electrode is disposed in a partial region of a pixel, to allow light to pass through a region devoid of the non-translucent electrode.

SUMMARY

However, the case in which the region devoid of the non-translucent electrode is provided in the pixel as in JPA2012-14859 has led to a concern of possibility of lowered display intensity.

It is therefore desirable to provide a display device and an electronic apparatus including the display device that make it possible to provide a non-light-emission region in a pixel while maintaining display intensity.

A display device according to an embodiment of the disclosure includes a pixel including a plurality of sub-pixels. Each of the plurality of sub-pixels includes: a light-emission region; and a non-light-emission region other than the light-emission region. The light-emission region includes one or more effective light-emission parts in which a first electrode, a light emitting layer, and a second electrode are stacked in order, and a light guide provided on side of the one or more effective light-emitting parts on which light is extracted.

An electronic apparatus according to an embodiment of the disclosure includes a display device. The display device includes a pixel including a plurality of sub-pixels. Each of the plurality of sub-pixels includes: a light-emission region; and a non-light-emission region other than the light-emission region. The light-emission region includes one or more effective light-emitting parts in which a first electrode, a light emitting layer, and a second electrode are stacked in order, and a light guide provided on side of the one or more effective light-emitting parts on which light is extracted.

DETAILED DESCRIPTION

Some embodiments of the disclosure are described below in detail with reference to the drawings. It is to be noted that the description is given in the following order.
1. Embodiment (a display device; an example in which light transparency is imparted to a non-light-emission region, while a plurality of effective light-emitting parts and a plurality of apertures are provided in a light-emission region, and a first electrode is a reflection layer)
2. Modification Example 1 (an example in which the effective light-emitting parts and the apertures differ in cross-sectional shapes)
3. Modification Example 2 (an example in which planar shapes of the effective light-emitting parts and the apertures are eclipses)
4. Modification Example 3 (an example in which the planar shapes of the effective light-emitting parts and the apertures are eclipses, and the eclipses have different orientations)
5. Modification Example 4 (an example in which the effective light-emitting parts and the apertures differ in the planar shapes)
6. Modification Example 5 (an example in which the planar shapes of the effective light-emitting parts and the apertures are quadrangles)
7. Modification Example 6 (an example in a single effective light-emitting part and a single aperture are provided in the light-emission region)
8. Modification Example 7 (an example in which a reflection film is provided in the non-light-emission region)
9. Modification Example 8 (an example in which the first electrode is a light transparent layer or a semi-transparent reflection layer, and a reflection layer is provided under the first electrode)
10. Application Example 1 (an electronic apparatus)

Figure 1:
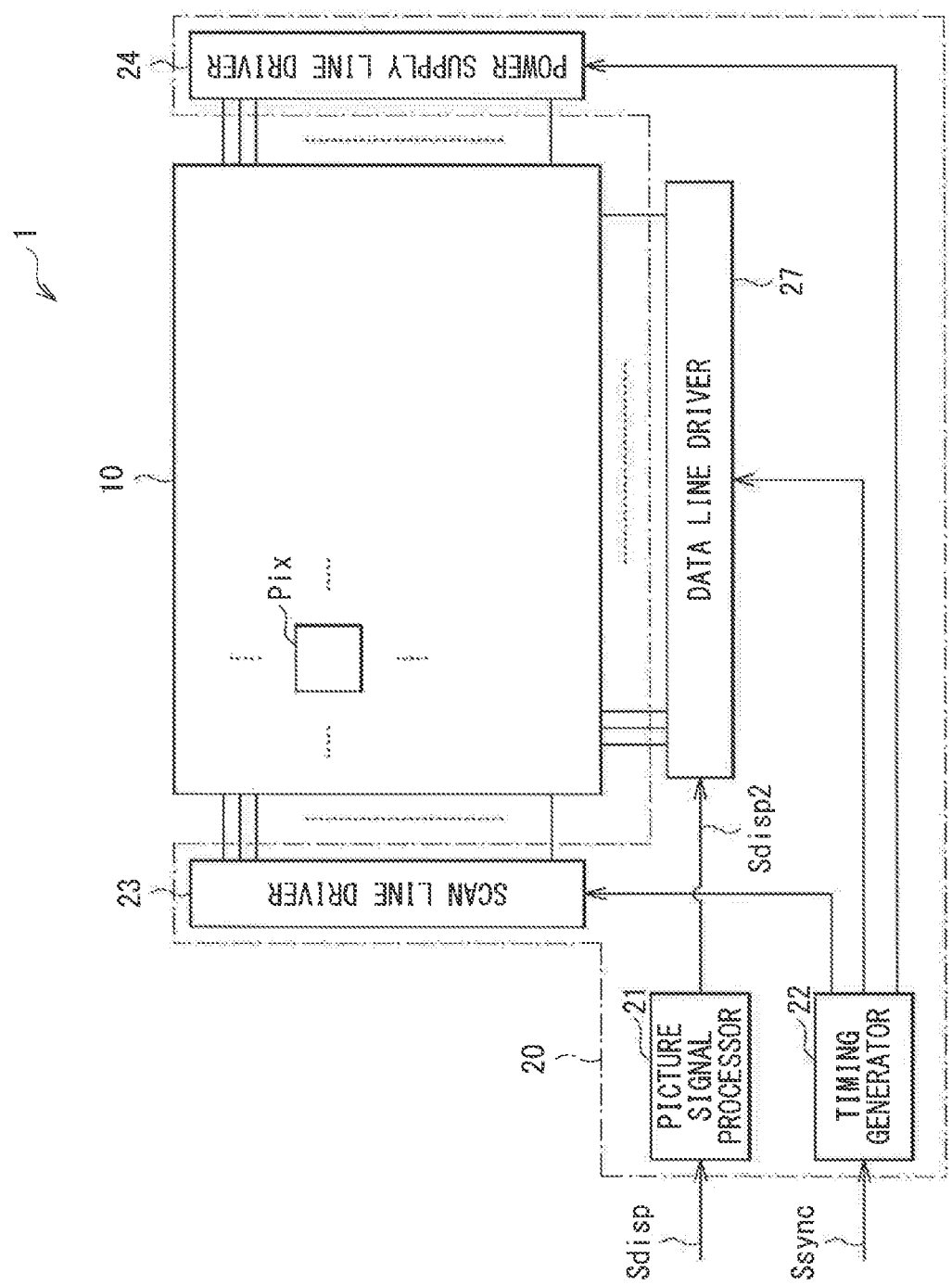
FIG. 1 is a block diagram of one configuration example of a display device according to one embodiment of the disclosure.

FIG. 1 illustrates one configuration example of a display device according to one embodiment of the disclosure. The display device 1 may be an active-matrix display device that utilizes organic EL elements, and include, for example but not limited to, a display unit 10 and a driver unit 20. The display unit 10 may include a plurality of pixels Pix disposed in a matrix. The driver unit 20 may include, for example but not limited to, a picture signal processor 21, a timing generator 22, a scan line driver 23, a power supply line driver 24, and a data line driver 27.

Figure 2:
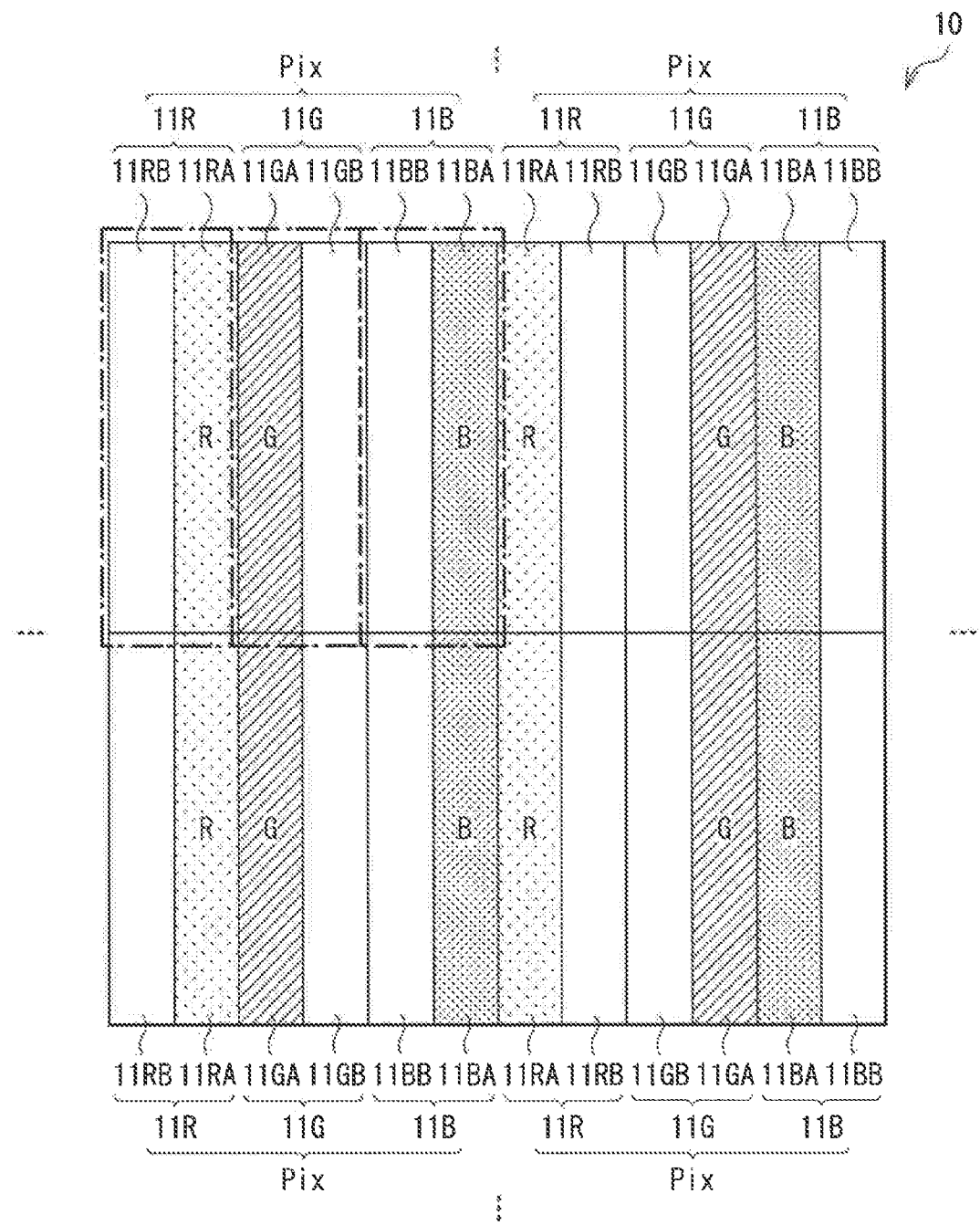
FIG. 2 schematically illustrates arrangement of sub-pixels in a pixel illustrated in FIG. 1.

FIG. 2 illustrates one example of a plan configuration of the pixel Pix illustrated in FIG. 1. The pixel Pix may be constituted by a plurality of, e.g., three sub-pixels 11R, 11G, and 11B, which are hereinafter generically referred to as "sub-pixels 11". The three sub-pixels may differ from one another in display colors. The sub-pixel 11R may perform display in red (R). The sub-pixel 11G may perform display in green (G). The sub-pixel 11B may perform display in blue (B). The sub-pixels 11R, 11G, and 11B may be shaped as a strip elongated in one direction. The sub-pixels 11R, 11G, and 11B may be disposed side-by-side in this order in a direction of shorter sides (in a horizontal direction in FIG. 2). The sub-pixels 11R, 11G, or 11B of the same color may be arranged in a direction of longer sides (in a vertical direction in FIG. 2).

The sub-pixels 11R, 11G, and 11B may respectively include light-emission regions 11RA, 11GA, and 11BA, and non-light-emission regions 11RB, 11GB, and 11BB other than the light-emission regions 11RA, 11GA, and 11BA.

The light-emission regions 11RA, 11GA, and 11BA may allow a light emitting element 12 described later to generate light, and perform image display. Description here is given on one exemplary case that involves allowing the light emitting element 12 to generate white light, and allowing a color filter CF described later to separate the white light generated into red (R), green (G), and blue (B).

The non-light-emission regions 11RB, 11GB, and 11BB may be other regions than the light-emission regions 11RA, 11GA, and 11BA in the sub-pixels 11R, 11G, and 11B, as mentioned above. The non-light-emission regions 11RB, 11GB, and 11BB may be regions that make no contribution to light emission by the light emitting element 12.

In one preferable but non-limiting example, an area ratio of the light-emission region 11RA, 11GA, or 11BA to the sub-pixel 11R, 11G or 11B may be, for example, equal to or lower than 70%. Assuming on interior illumination of 400 luxes, the non-light-emission regions 11RB, 11GB, and 11BB each having the area ratio of 30% may provide illumination of about 120 luxes. This leads one to expect that light passing through the non-light-emission regions 11RB, 11GB, and 11BB becomes hardly visible. It is to be noted that FIG. 2 illustrates a case in which the area ratio of the light-emission region 11RA, 11GA, or 11BA to the sub-pixel 11R, 11G, or 11B is 50%.

Figure 3:
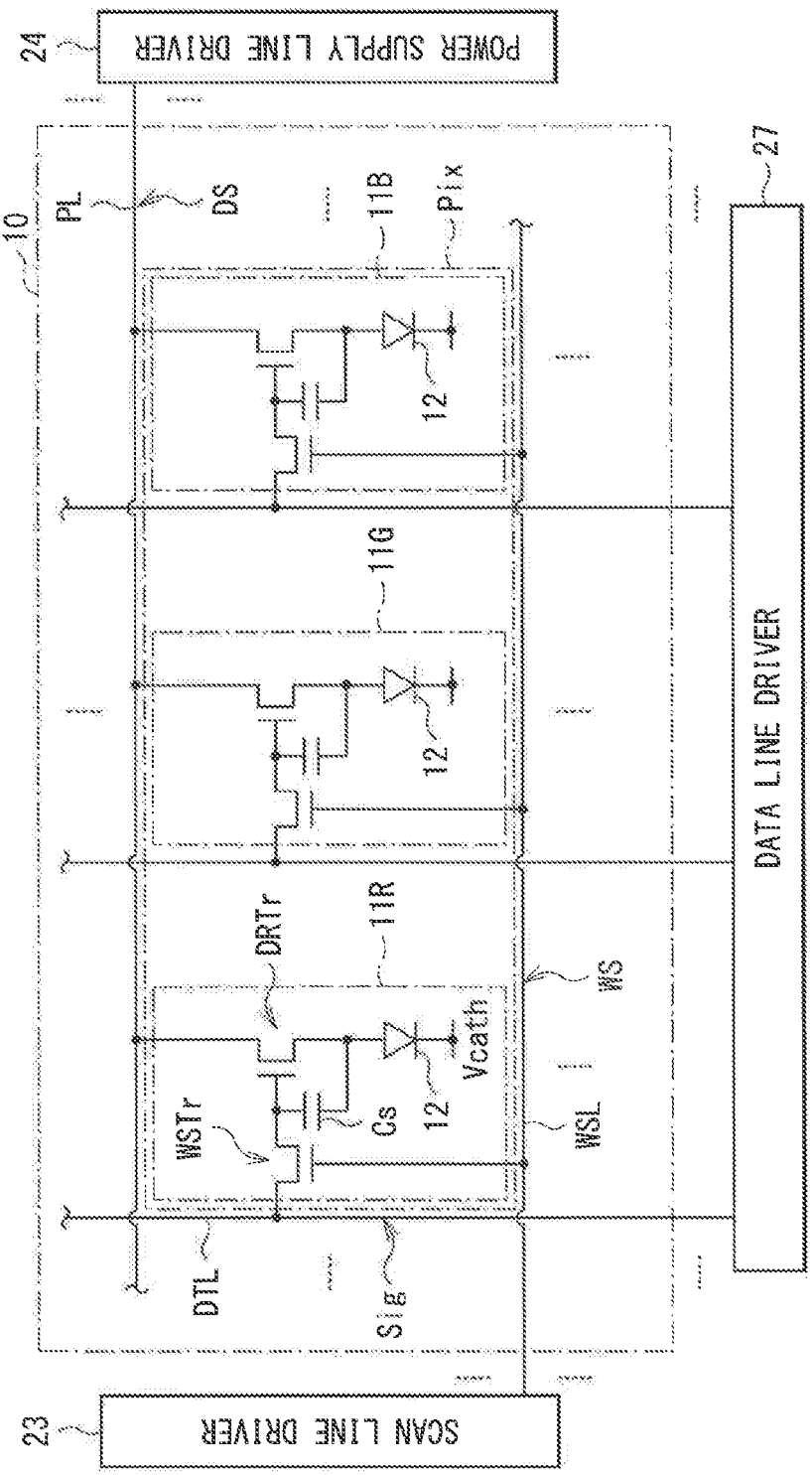
FIG. 3 is a circuit diagram of one configuration example of a display unit illustrated in FIG. 1.

FIG. 3 illustrates one example of a circuit configuration of the display unit 10 illustrated in FIG. 1. The display unit 10 may include a plurality of scan lines WSL, a plurality of power lines PL, and a plurality of data lines DTL. The plurality of scan lines WSL may extend in a row direction. The plurality of power lines PL may extend in the row direction. The plurality of data lines DTL may extend in a column direction. One end of the scan line WSL may be coupled to the scan line driver 23. The sub-pixels 11R, 11G and 11B that belong to the single pixel Pix may be coupled to the same scan line WSL and to the same power line PL. The sub-pixels 11R, 11G and 11B that belong to the single pixel Pix may be coupled to the respectively different data lines DTL.

Description is given next of a circuit configuration of the sub-pixels 11, with the sub-pixel 11R being given as an example. Note that the same may apply to the circuit configurations of the sub-pixels 11G and 11B.

The sub-pixel 11R may include a write transistor WSTr, a drive transistor DRTr, a capacitor Cs, and the light emitting element 12. The write transistor WSTr and the drive transistor DRTr may be constituted by, for example but not limited to, N-channel MOS (Metal Oxide Semiconductor) TFTs (Thin Film Transistors). In the sub-pixel 11R, the write transistor WSTr may include a gate coupled to the scan line WSL, a source coupled to the data line DTL, and a drain coupled to a gate of the drive transistor DRTr and a first end of the capacitor Cs. The drive transistor DRTr may include a gate coupled to the drain of the write transistor WSTr and the first end of the capacitor Cs, a drain coupled to the power line PL, and a source coupled to a second end of the capacitor Cs and an anode, i.e., a first electrode of the light emitting element 12. The capacitor Cs may include the first end coupled to the gate of the drive transistor DRTr and the drain of the write transistor WSTr, and the second end coupled to the source of the drive transistor DRTr and the anode, i.e., the first electrode of the light emitting element 12. The light emitting element 12 may be constituted by, for example but not limited to, an organic EL element. The light emitting element 12 may include the anode, i.e., the first electrode coupled to the source of the drive transistor DRTr and the second end of the capacitor Cs, and a cathode, i.e., a second electrode supplied with a cathode voltage Vcath by the driver unit 20.

The picture signal processor 21 illustrated in FIG. 1 may perform predetermined processing such as gamma conversion, on a picture signal Sdisp supplied from outside, to generate a picture signal Sdisp2.

The timing generator 22 illustrated in FIG. 1 may be a circuit that supplies, on the basis of a synchronization signal S sync supplied from the outside, the scan line driver 23, the power supply line driver 24, and the data line driver 27 with respective control signals, to control them to operate in synchronization with one another.

The scan line driver 23 illustrated in FIGS. 1 and 3 may sequentially apply, on the basis of the control signal supplied from the timing generator 22, scan signals WS to the plurality of scan lines WSL, to sequentially select the sub-pixels 11.

The power supply line driver 24 illustrated in FIGS. 1 and 3 may sequentially apply, on the basis of the control signal supplied from the timing generator 22, power signals DS to the plurality of power lines PL, to control operation of light emission and operation of light extinction of the sub-pixels 11. The power signal DS may transit between a voltage Vccp and a voltage Vini. The voltage Vini may be a voltage that initializes the sub-pixels 11. The voltage Vccp may be a voltage that allows a current to flow through the drive transistor DRTr to cause the light emitting element 12 to perform the light emission.

The data line driver 27 illustrated in FIGS. 1 and 3 may generate a signal Sig, on the basis of the picture signal Sdisp2 supplied from the picture signal processor 21 and the control signal supplied from the timing generator 22. The signal Sig may include a pixel voltage Vsig and a voltage Vofs. The pixel voltage Vsig may indicate light emission intensity of each of the sub-pixels 11. The voltage Vofs may be provided for Vth correction. The data line driver 27 may apply the signal Sig generated, to each of the data lines DTL.

Figure 4:
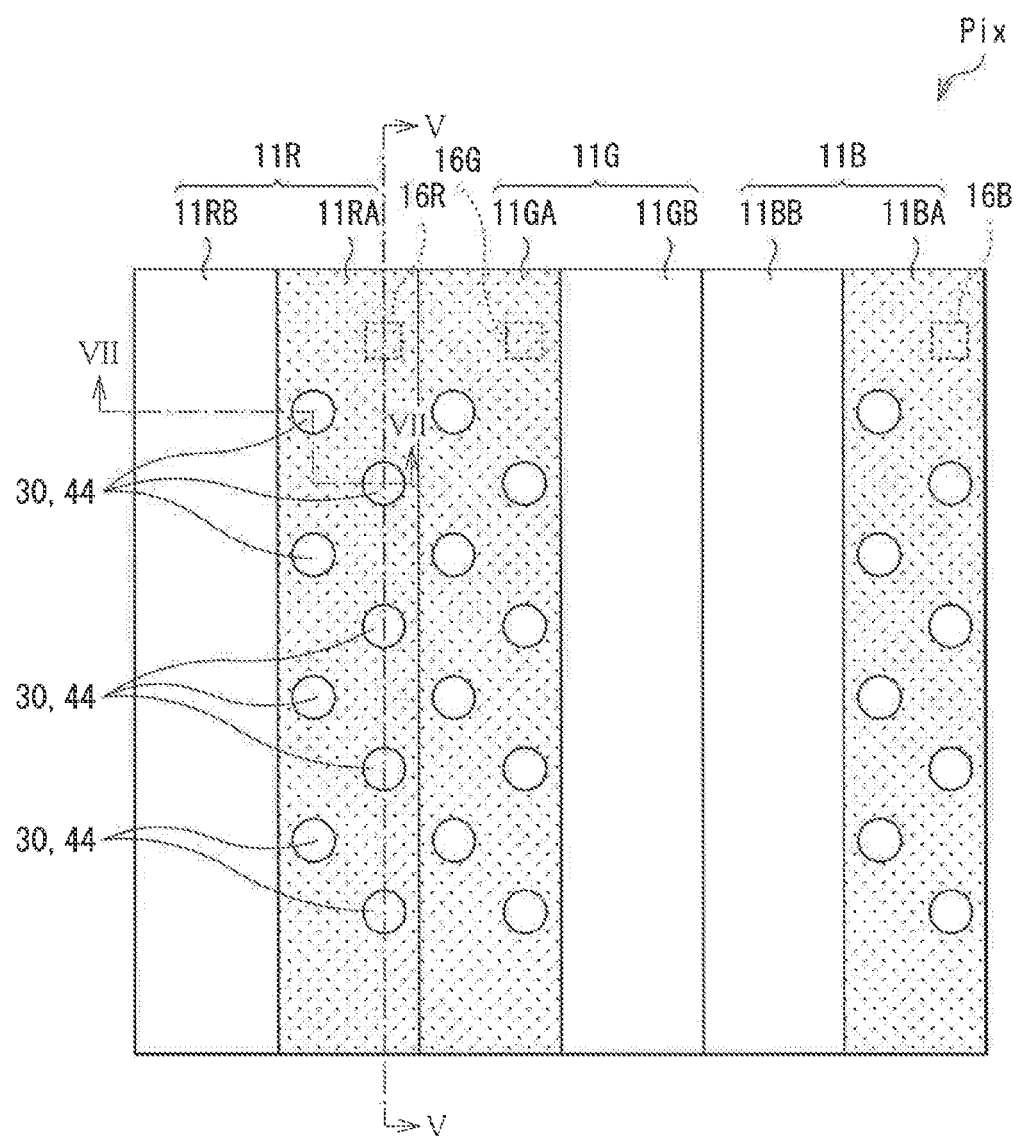
FIG. 4 is a plan view of one arrangement example of effective light-emitting parts and a light guide in a light-emission region illustrated in FIG. 2.
Figure 5:
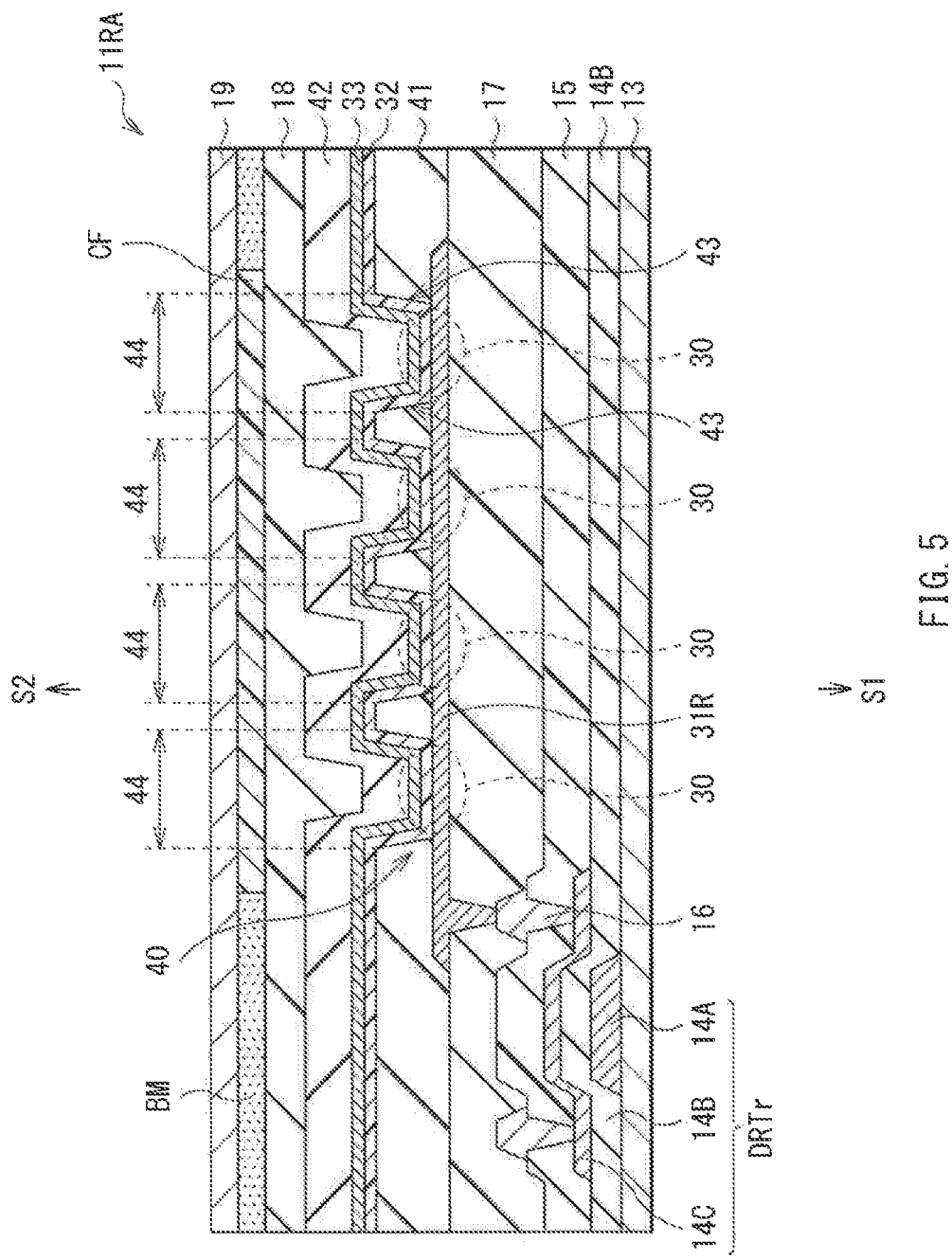
FIG. 5 is a cross-sectional view of one configuration example of the light-emission region illustrated in FIG. 4.

FIG. 4 illustrates one example of a plan configuration of the light-emission regions 11RA, 11GA, and 11BA illustrated in FIG. 2. FIG. 5 illustrates a cross-sectional configuration taken along a line V-V in the light-emission region 11RA illustrated in FIG. 4. It is to be noted that the same may apply to the light-emission regions 11GA and 11BA.

Referring to FIG. 5, the light-emission region 11RA may include, without limitation, on a first substrate 13, the drive transistor DRTr, an interlayer insulating film 15, a contact-wiring layer 16, a planarization insulating layer 17, the first electrodes 31R, 31G, and 31B, a first insulating layer 41, a light emitting layer 32, a second electrode 33, a second insulating layer 42, an adhesive layer 18, the color filter CF, a black matrix BM, and a second substrate 19, in the order named. The drive transistor DRTr may include a gate electrode 14A, a gate insulating layer 14B, and a semiconductor layer 14C. In what follows, simplified description is given of materials of each layer.

The first substrate 13 may be a carrier substrate of the display unit 10, and may be made of, for example but not limited to, glass or a plastic.

The drive transistor DRTr may include, without limitation, on the first substrate 13, the gate electrode 14A, the gate insulating layer 14B, and the semiconductor layer 14C, in the order named. The gate electrode 14A may be provided in an island shape on the first substrate 13, and made of, for example but not limited to, molybdenum (Mo). The gate insulating layer 14B may be provided on the first substrate 13 and the gate electrode 14A, and made of, for example but not limited to, silicon oxide ($SiO_2$) or silicon nitride (SiNx). The semiconductor layer 14C may be provided in the island shape in a region confronted with the gate electrode 14A on the gate insulating layer 14B, and made of, for example but not limited to, polysilicon. The semiconductor layer 14C may be made of an oxide semiconductor or an organic semiconductor. Though not illustrated, the write transistor WSTr illustrated in FIG. 3 may have a similar configuration to that of the drive transistor DRTr. It is to be noted that in this example, description is given on a case as where the drive transistor DRTr may have a configuration of a so-called bottom gate structure in which the semiconductor layer 14C is provided above the gate electrode 14A, but this is non-limiting. The transistors may have a configuration of a so-called top gate structure in which a semiconductor layer is provided below a gate electrode.

The interlayer insulating film 15 may be provided on the semiconductor layer 14C and the gate insulating layer 14B, and made of, for example but not limited to, a similar material to that of the gate insulating layer 14B. The contact-wiring layer 16 may be coupled to the semiconductor layer 14C through a through hole provided in the interlayer insulating film 15. The contact-wiring layer 16 may have, for example but not limited to, a tri-layer configuration of titanium (Ti)/aluminum (Al)/titanium (Ti). The planarization insulating layer 17 may be provided on the interlayer insulating film 15 and the contact-wiring layer 16, and made of, for example but not limited to, an organic insulating material such as polyimide and an acrylic resin.

The first electrodes 31R, 31G and 31B, i.e., the anodes may be provided on the planarization insulating layer 17, for each of the light-emission regions 11RA, 11GA, and 11BA. The first electrodes 31R, 31G and 31B may be, for example but not limited to, reflection electrodes made of a material having high reflectivity, e.g., aluminum (Al), an alloy including aluminum (Al), silver (Ag), and an alloy including silver (Ag). The first electrodes 31R, 31G and 31B may allow light generated in the light emitting layer 32 to be extracted from side on which the second electrode 33 is disposed. This system is referred to as "top emission". In one specific but non-limiting example, the first electrodes 31R, 31G and 31B may be constituted by, for example but not limited to, a stacked film of an ITO layer and an Al alloy layer, a single layer film of the Al alloy, a stacked film of the ITO layer and an Ag layer, or a stacked film of the ITO layer and an Ag alloy layer. The first electrodes 31R, 31G and 31B may be coupled to the contact wiring layer 16 that is coupled to the source of the drive transistor DRTr, through a through hole provided in the planarization insulating layer 17.

The first insulating layer 41 may be provided on the first electrodes 31R, 31G and 31B, and made of, for example but not limited to, the organic insulating material similar to that of the planarization insulating layer 17.

The light emitting layer 32 may generate, for example but not limited to, white light, and be provided as a common layer to the plurality of pixels Pix in the display unit 10. The light emitting layer 32 may have a configuration of, for example but not limited to, a stack of a red light emitting layer, a green light emitting layer, and a blue light emitting layer, or alternatively the light emitting layer 32 may have a stacked configuration of a yellow light emitting layer and the blue light emitting layer.

The second electrode 33, i.e., the cathode may be provided as a common electrode of the plurality of pixels Pix in the display unit 10. The second electrode 33 may be constituted by a transparent electrode or a semi-transparent reflection electrode. The second electrode 33 may be made of, for example but not limited to, a magnesium-silver (Mg—Ag) alloy, or IZO (registered trademark). In a case in which the second electrode 33 is made of the magnesium-silver alloy, its film thickness may be, for example, about several nanometers. This makes it possible to impart semi-transparency to the second electrode 33. In a case in which the second electrode 33 is made of IZO (registered trademark), in one preferable but non-limiting example, the film thickness may be, for example, several tens of nanometers to several thousands of nanometers both inclusive. Specifically, IZO, being a transparent material, may be formed with a relatively large thickness, so as to provide a desired, low sheet resistance value.

The second insulating layer 42 may be provided on the second electrode 33, and made of, for example but not limited to, silicon nitride (SiNx). The second insulating layer 42 may also have a function as a protection film that prevents a change in characteristics such as light emission efficiency because of intrusion of moisture into the light emitting layer 32.

The adhesive layer 18 may bond the second insulating layer 42 to the second substrate 19. On a surface of the second substrate 19, the color filter CF and the black matrix BM may be formed. The adhesive layer 18 may also provide sealing of the light emitting layer 32.

The color filter CF may turn the white light generated in the light emitting layer 32 into color light in red (R), green (G), and blue (B), for the extraction of the color light. The color filter CF may be provided on the surface of the second substrate 19 on which the adhesive layer 18 is disposed. The color filter CF in red (R) may be provided in a part confronted with the light-emission region 11RA of the sub-pixel 11R. The color filter CF in green (G) may be provided in a part confronted with the light-emission region 11GA of the sub-pixel 11G. The color filter CF in blue (B) may be provided in a part confronted with the light-emission region 11BA of the sub-pixel 11B. The color filter CF may be made of, for example but not limited to, a resin mixed with a pigment. Selecting the pigment allows for adjustment of light transmittance, so as to allow the light transmittance to be high in a target wavelength range of red, green, or blue, and to allow the light transmittance to be low in other wavelength ranges.

The black matrix BM may be a light shielding film that is provided at a position confronted with a borderline between the adjacent pixels Pix, on the second substrate 19. The black matrix BM may have a function of absorbing external light reflected by the first electrodes 31R, 31G, and 31B and wirings between the first electrodes 31R, 31G, and 31B, to improve contrast. The black matrix BM may be made of, for example but not limited to, a black resin.

The second substrate 19 may be positioned on side of the light emitting layer 32 on which the second electrode 33 is disposed. The second substrate 19, together with the adhesive layer 18, may provide the sealing of the light emitting layer 32. The second substrate 19 may be made of, for example but not limited to, a material that is transparent with respect to the light generated in the light emitting layer 32, e.g., glass.

Description is given next of further details of the configuration of the light-emission regions 11RA, 11GA, and 11BA in this embodiment.

The light-emission region 11RA may include, as illustrated in FIG. 4, one or more (e.g., eight in FIG. 4) effective light-emitting parts 30, and a light guide 40. As illustrated in FIG. 5, each of the eight effective light-emitting parts 30 may have a configuration in which the first electrode 31R (or 31G, or 31B), i.e., the anode, the light emitting layer 32, and the second electrode 33, i.e., the cathode are stacked in the order named. A stacked body of the first electrode 31R (or 31G, or 31B), the light emitting layer 32, and the second electrode 33 may constitute the light emitting element 12 as described (refer to FIG. 3.). The light guide 40 may be provided on side of the eight effective light-emitting parts 30 on which the light is extracted. Thus, in this display device 1, it is possible to provide the non-light-emission regions 11RB, 11GB, and 11BB in the pixel Pix while maintaining display intensity.

Specifically, the effective light-emitting part 30 may be a part, out of the light-emission region 11RA, 11GA, or 11BA, that is provided with the stacked body of the first electrode 31R (or 31G, or 31B), the light emitting layer 32, and the second electrode 33, i.e., the light emitting element 12, and allows the light emitting element 12 to perform the light emission. The light guide 40 may guide the light generated in the effective light-emitting part 30 toward a front direction, and enhance light extraction efficiency. Thus, in this display device 1, it is possible to compensate a decrease in the display intensity due to a decrease in the area ratio of the light-emission regions 11RA, 11GA, and 11BA, even in a case in which the light-emission regions 11RA, 11GA, and 11BA and the non-light-emission regions 11RB, 11GB, and 11BB are provided in the sub-pixels 11R, 11G, and 11B. This makes it possible to maintain or enhance the display intensity of the light-emission regions 11RA, 11GA, and 11BA.

In one preferable but non-limiting example, the light guide 40 may include, for example but not limited to, the first insulating layer 41 and a reflector 43. In one preferable but non-limiting example, as illustrated in FIG. 4, the first insulating layer 41 may have one or more (e.g., eight in FIG. 4) apertures 44 confronted with the respective eight effective light-emitting parts 30. The apertures 44 may serve as a path of the light generated in the effective light-emitting parts 30. An axial direction of the apertures 44 may be, for example, same or substantially same as a direction in which the first electrode 31R (or 31G, or 31B), the light emitting layer 32, and the second electrode 33 are stacked. In one preferable but non-limiting example, the reflector 43 may be provided on a side surface of each of the eight apertures 44. This allows the light guide 40 to guide the light generated in the effective light-emitting parts 30 toward the front direction, leading to enhancement in the light extraction efficiency.

In one preferable but non-limiting example, planar shapes of the effective light-emitting parts 30 and the apertures 44 of the light guide 40 may be, for example, circles. In one preferable but non-limiting example, each of the eight apertures 44 may be shaped as a truncated cone. This allows the side surface of the aperture 44, i.e., the reflector 43 to be a tapered surface, making it possible for the reflector 43 to reflect frontward the light generated in the effective light-emitting parts 30.

Figure 6:
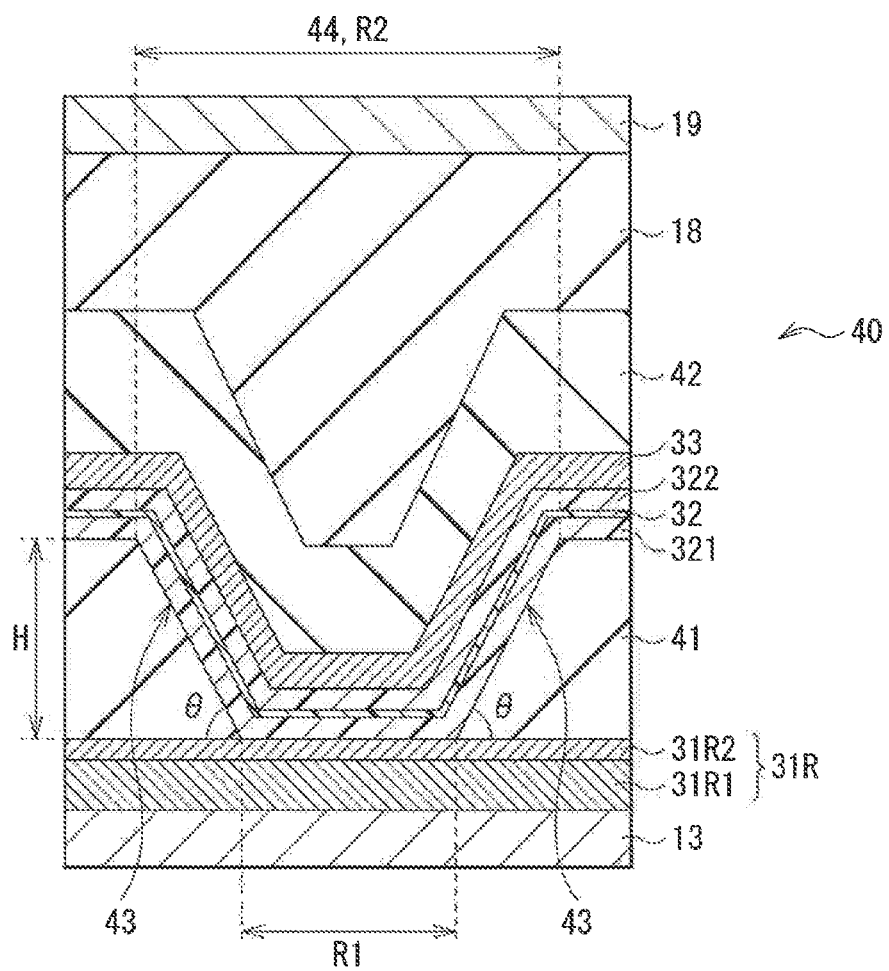
FIG. 6 is an enlarged cross-sectional view of the light guide illustrated in FIG. 5.

FIG. 6 illustrates, in an enlarged manner, the light guide 40 illustrated in FIG. 5. It is to be noted that FIG. 6 illustrates a case in which the first electrode 31R has a stacked configuration of an Al alloy layer 31R1 and an ITO layer 31R2, with a hole injection and transportation layer 321 interposed between the first electrode 31R and the light emitting layer 32, and with an electron transportation layer 322 interposed between the second electrode 33 and the light emitting layer 32.

In one preferable but non-limiting example, the light guide 40 may further include the second insulating layer 42 having a different refractive index from a refractive index of the first insulating layer 41. In other words, in one preferable but non-limiting example, the reflector 43 may be a reflection interface that is constituted by a difference between the refractive indexes of the first insulating layer 41 and the second insulating layer 42. The second insulating layer 42 may be provided, for example but not limited to, inside the eight apertures 44 and on the first insulating layer 41. However, it is sufficient for the second insulating layer 42 to be provided at least inside the eight apertures 44.

In one preferable but non-limiting example, the refractive index n2 of the second insulating layer 42 and the refractive index n1 of the first insulating layer 41 may satisfy Expression 1 and Expression 2. This allows for highly efficient light reflection by the reflector 43, i.e., the reflection interface with utilization of the difference between the refractive indexes, making it possible to maintain or enhance the display intensity.

$$1.1 \leq n2 \leq 1.8 \quad \text{(Expression 1)}$$

$$n2 - n1 \geq 0.20 \quad \text{(Expression 2)}$$

In one preferable but non-limiting example, a height H of the first insulating layer 41, an aperture diameter R1 on lower-end side of the aperture 44, and an aperture diameter R2 on upper-end side of the aperture 44 may satisfy Expression 3 and Expression 4 as follows. This allows for the highly efficient light reflection by the reflector 43, making it possible to maintain or enhance the display intensity.

$$R1/R2 < 1.0 \quad \text{(Expression 3)}$$

$$0.5 \leq H/R1 \leq 2.0 \quad \text{(Expression 4)}$$

Figure 7:
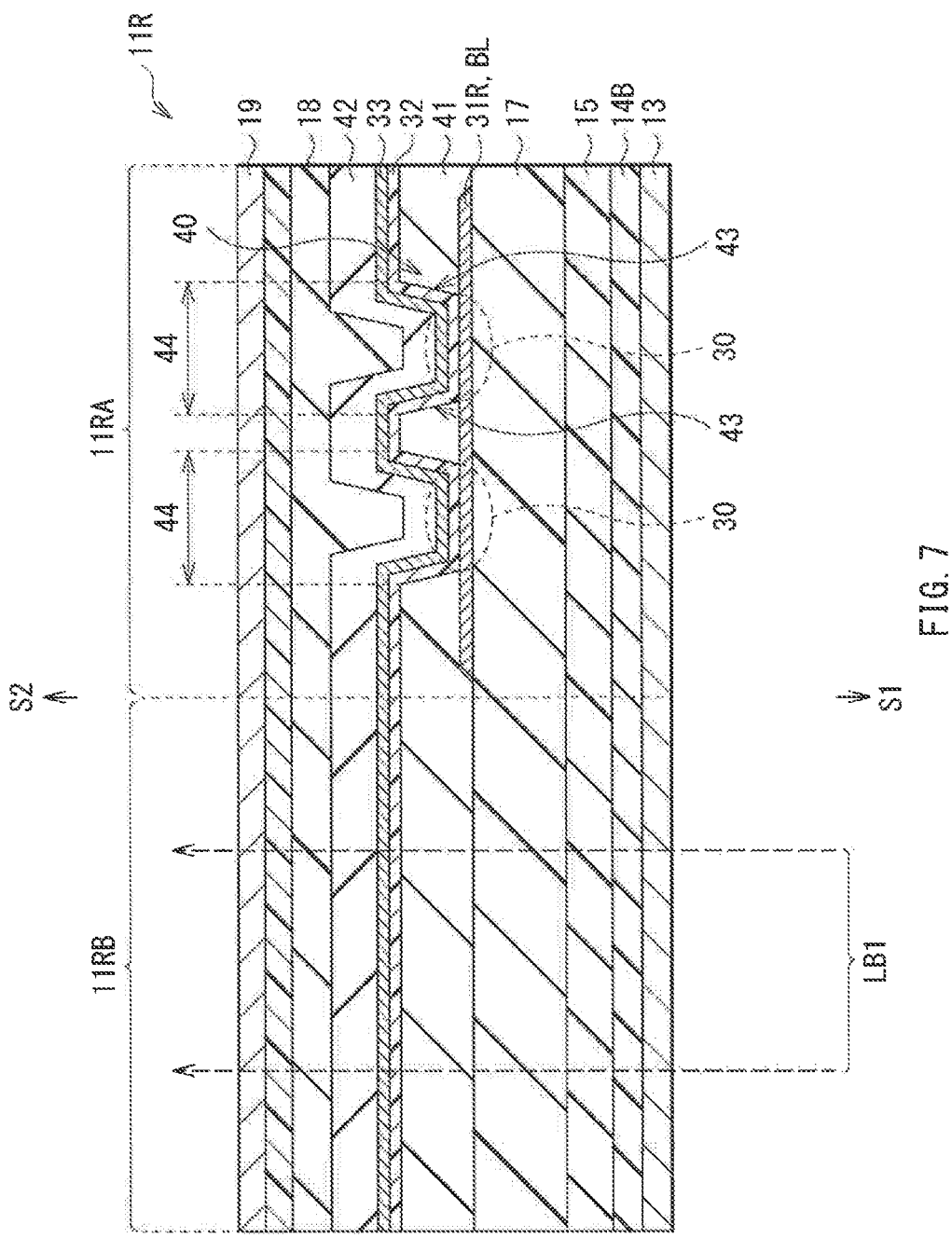
FIG. 7 is a cross-sectional view of one configuration example of the light-emission region and a non-light-emission region illustrated in FIG. 4.

FIG. 7 illustrates a cross-sectional configuration taken along a line VII-VII in the light-emission region 11RA and the non-light-emission region 11RB illustrated in FIG. 4. It is to be noted that the same may apply to the light-emission regions 11GA and 11BA, and the non-light-emission regions 11GB and 11BB.

The light-emission region 11RA may include, as described, without limitation, on the first substrate 13, the drive transistor DRTr, the interlayer insulating film 15, the contact-wiring layer 16, the planarization insulating layer 17, the first electrodes 31R, 31G and 31B, the first insulating layer 41, the light emitting layer 32, the second electrode 33, the second insulating layer 42, the adhesive layer 18, the color filter CF, the black matrix BM, and the second substrate 19, in the order named. The drive transistor DRTr may include the gate electrode 14A, the gate insulating layer 14B, and the semiconductor layer 14C, referring to FIG. 5.

The non-light-emission region 11RB may include, without limitation, on the first substrate 13, the gate insulating layer 14B, the interlayer insulating film 15, the planarization insulating layer 17, the first insulating layer 41, the light emitting layer 32, the second electrode 33, the second insulating layer 42, the adhesive layer 18, and the second substrate 19, in the order named.

In one preferable but non-limiting example, the non-light-emission regions 11RB, 11GB, and 11BB may have light transparency. In other words, in one preferable but non-limiting example, the non-light-emission regions 11RB, 11GB, and 11BB may be able to transmit light LB1 from background side S1 toward display-surface side S2. This makes it possible to provide background transparency, making it possible to display an image in superimposed or merged relation to a background. The background transparency refers to a state in which a background of a screen, i.e., the display unit 10 is seen through the screen, i.e., the display unit 10. In other words, the display device 1 may be a see-through display device.

In one preferable but non-limiting example, the light-emission region 11RA may include a bottom layer BL, at lower ends of the eight apertures 44. The bottom layer BL may be common to the eight effective light-emitting parts 30. In one preferable but non-limiting example, the bottom layer BL may be provided in the light-emission region 11RA, to avoid overlap with the non-light-emission region 11RB. This makes it possible to enhance the background transparency of the non-light-emission region 11RB.

In one preferable but non-limiting example, the bottom layer BL may serve as the first electrodes 31R, 31G, and 31B. This allows for simplification of the configuration of the light-emission region 11RA. In this case, in one preferable but non-limiting example, the first insulating layer 41 may be provided between the bottom layer BL, i.e., the first electrode 31R, 31G and 31B, and the light emitting layer 32 and the second electrode 33. In one preferable but non-limiting example, the eight effective light-emitting parts 30 may be parts in which the light emitting layer 32 and the second electrode 33 are stacked in the order named on the first electrode 31R (or 31G or 31B) at bottoms of the respective eight apertures 44.

In one preferable but non-limiting example, the bottom layer BL, i.e., the first electrode 31R, 31G and 31B in this embodiment, may be a reflection layer. This allows the bottom layer BL, i.e., the first electrode 31R, 31G and 31B to reflect upward the light generated in the light emitting layer 32 and traveling downward. Hence, it is possible to enhance the light extraction efficiency, making it possible to maintain or enhance the display intensity.

Figure 8:
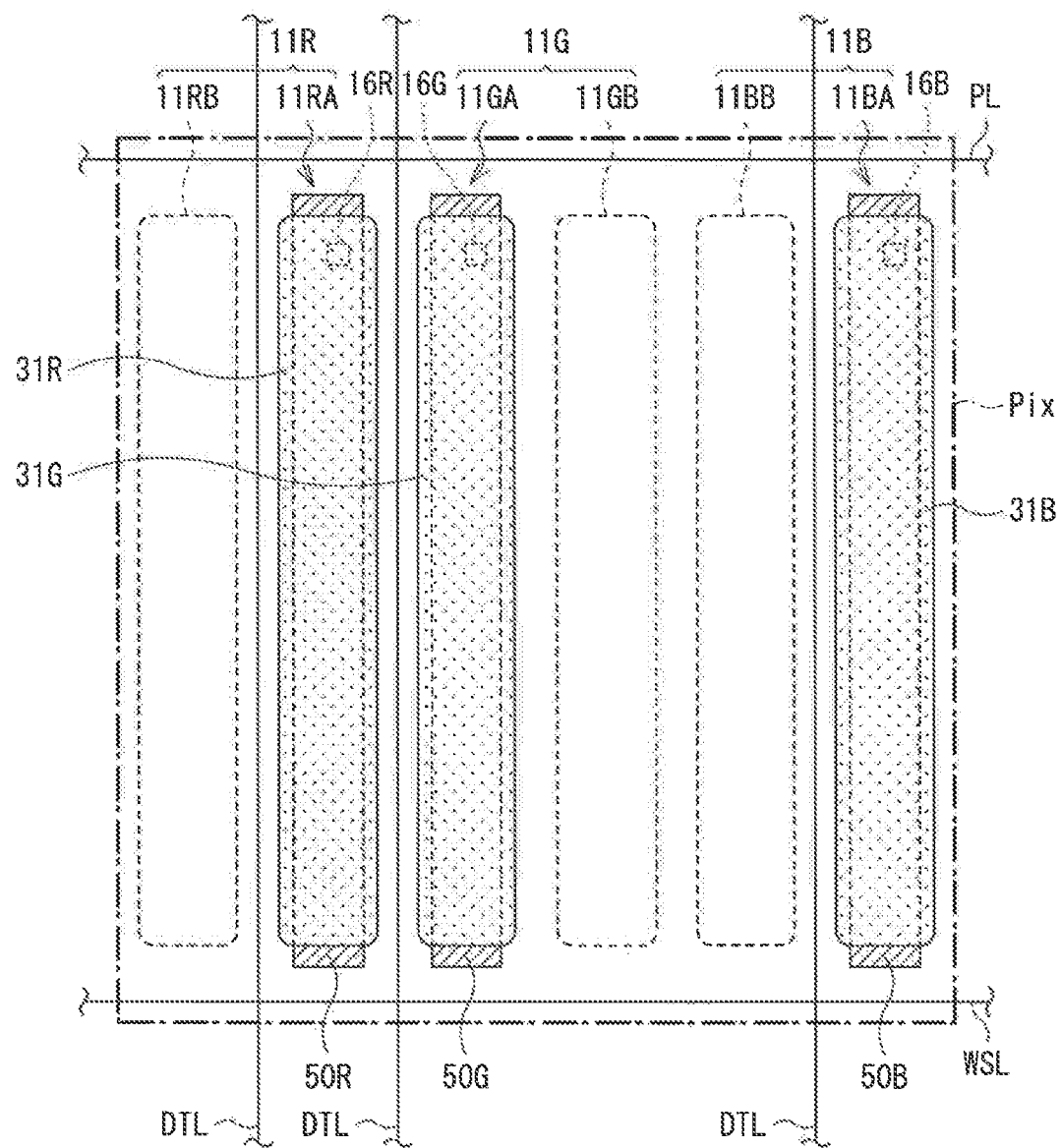
FIG. 8 is a plan view of one arrangement example of the light-emission region, the non-light-emission region, and a pixel circuit in the pixel illustrated in FIG. 2.

FIG. 8 illustrates one example of a planar arrangement of the first electrodes 31R, 31G and 31B, the non-light-emission regions 11RB, 11GB, and 11BB, which are illustrated in FIG. 7, and circuit regions 50R, 50G and 50B illustrated in FIG. 5. The circuit regions 50R, 50G and 50B may include components such as the drive transistors DRTr.

The first electrode 31R may be the first electrode, i.e., the anode of the sub-pixel 11R, and provided in the light-emission region 11RA of the sub-pixel 11R. The first electrode 31G may be the first electrode, i.e., the anode of the sub-pixel 11G and provided in the light-emission region 11GA of the sub-pixel 11G. The first electrode 31B may be the first electrode, i.e., the anode of the sub-pixel 11B, and provided in the light-emission region 11BA of the sub-pixel 11B. The first electrodes 31R, 31G and 31B may be shaped as, without limitation, the strip elongated in one direction, and disposed side-by-side in this order in the direction of the shorter sides, as with the sub-pixels 11R, 11G and 11B illustrated in FIG. 2. The first electrodes 31R, 31G, or 31B of the sub-pixels 11R, 11G or 11B of the same color may be arranged in the direction of the longer sides.

In one preferable but non-limiting example, the plurality of sub-pixels 11R, 11G and 11B may further include the respective circuit regions 50R, 50G and 50B. The circuit region 50R may be a region in the sub-pixel 11R, in which other elements than the light emitting element 12 are disposed. The circuit region 50G may be a region in the sub-pixel 11G in which other elements than the light emitting element 12 are disposed. The circuit region 50B may be a region in the sub-pixel 11B, in which other elements than the light emitting element 12 are disposed. The circuit regions 50R, 50G and 50B may be shaped as the strip elongated in one direction, and disposed side-by-side in this order in the direction of the shorter sides, as with the first electrodes 31R, 31G, and 31B. The circuit regions 50R, 50G or 50B of the sub-pixels 11R, 11G or 11B of the same color may be arranged in the direction of the longer sides. The circuit regions 50R, 50G and 50B may include, for example but not limited to, the write transistor WSTr and the capacitor Cs, which are illustrated in FIG. 3, in addition to the drive transistor DRTr illustrated in FIG. 5. The source of the drive transistor DRTr may be coupled to the first electrode 31R, 31G or 31B, through a contact 16R, 16G or 16B of the contact-wiring layer 16.

In one preferable but non-limiting example, the circuit regions 50R, 50G and 50B may be provided under the first electrodes 31R, 31G and 31B of the light-emission regions 11RA, 11GA, and 11BA, to avoid the overlap with the non-light-emission regions 11RB, 11GB, and 11BB. This makes it possible to avoid a decrease in the background transparency of the non-light-emission regions 11RB, 11GB, and 11BB.

The display device 1 may be manufactured, for example, as follows.

First, the gate electrode 14A, the gate insulating layer 14B, and the semiconductor layer 14C may be formed on the first substrate 13 made of the material as described above. Thus, the circuit regions 50R, 50G and 50B including the drive transistor DRTr may be formed. Thereafter, the interlayer insulating film 15 may be formed on the surface of the first substrate 13 on which the circuit regions 50R, 50G, and 50B are formed. The contact-wiring layer 16 may be formed on the interlayer insulating film 15. The contact-wiring layer 16 may be coupled to the source of the drive transistor DRTr, through the through hole provided in the interlayer insulating film 15. The planarization insulating layer 17 may be formed on the interlayer insulating film 15 and the contact-wiring layer 16.

Thereafter, an undepicted first electrode material film may be formed on the planarization insulating layer 17, by a sputtering method, without limitation. The undepicted first electrode material film may be made of, for example but not limited to, an aluminum (Al) alloy. The undepicted first electrode material film may be patterned into a predetermined shape by etching. Thus, the first electrodes 31R, 31G and 31B may be formed.

Thereafter, an undepicted first insulating layer material film may be formed on the first electrodes 31R, 31G and 31B. The undepicted first insulating layer material film may be patterned into a predetermined shape by etching or photolithography. Thus, the first insulating layer 41 having the apertures 44 may be formed.

After the formation of the first insulating layer 41, the light emitting layer 32 and the second electrode 33 may be sequentially formed on a surface of the first electrodes 31R, 31G and 31B and the first insulating layer 41, by a vapor deposition method, without limitation. Thus, the effective light-emitting parts 30 may be formed at the bottoms of the apertures 44. The effective light-emitting parts 30 may be constituted by the stacked body of the first electrodes 31R, 31G and 31B, the light emitting layer 32, and the second electrode 33, i.e., the light emitting element 12.

After the formation of the effective light-emitting parts 30, the second insulating layer 42 may be formed on the second electrode 33, by a CVD method or the sputtering method, without limitation. Thus, the reflector 43 may be formed on the side surface of the aperture 44. The reflector 43 may be constituted by the reflection interface with the utilization of the difference between the refractive indexes of the first insulating layer 41 and the second insulating layer 42. Thus, the light guide 40 including the first insulating layer 41, the reflector 43, and the apertures 44 may be formed.

After the formation of the light guide 40, the adhesive layer 18 may be formed on the second insulating layer 42. The second substrate 19 may be prepared on which the color filter CF and the black matrix BM are provided. The second substrate 19 may be bonded onto the second insulating layer 42 with the adhesive layer 18 in between. With the forgoing procedure, the display device 1 illustrated in FIG. 5 may be completed.

In this display device 1, the picture signal processor 21 may perform the predetermined processing on the picture signal Sdisp supplied from the outside, to generate the picture signal Sdisp2. The timing generator 22 may supply, on the basis of the synchronization signal Ssync supplied from the outside, the scan line driver 23, the power supply line driver 24, and the data line driver 27 with the respective control signals, to control them to operate in synchronization with one another. The scan line driver 23 may sequentially apply, in accordance with the control signal supplied from the timing generator 22, the scan signal WS to the plurality of scan lines WSL, to sequentially select the sub-pixels 11R, 11G and 11B. The power supply line driver 24 may sequentially apply, in accordance with the control signal supplied from the timing generator 22, the power signal DS to the plurality of power lines PL, to control the operation of the light-emission and the operation of the light extinction of the sub-pixels 11R, 11G and 11B. The data line driver 27 may generate the signal Sig, in accordance with the picture signal Sdisp2 supplied from the picture signal processor 21 and the control signal supplied from the timing generator 22. The signal Sig may include the pixel voltage Vsig and the voltage Vofs. The pixel voltage Vsig may correspond to the intensity of each of the sub-pixels 11R, 11G, and 11B. The voltage Vofs may be provided for the Vth correction. The data line driver 27 may apply the signal Sig generated, to each of the data lines DTL. The display unit 10 may perform display on the basis of the scan signal WS, the power signal DS, and the signal Sig supplied from the driver unit 20.

In the sub-pixels 11R, 11G and 11B of the display unit 10, the scan signal WS may be supplied from the scan line driver 23 through the gate of the write transistor WSTr. The pixel voltage Vsig from the data line driver 27 may be retained by the capacitor Cs through the write transistor WSTr. A current may flow through the drive transistor DRTr in accordance with the pixel voltage Vsig, to cause a source voltage and a gate voltage of the drive transistor DRTr to increase together. When the source voltage of the drive transistor DRTr becomes larger than a predetermined value, a current may flow between the anode and the cathode of the light emitting element 12. This causes re-combination of holes and electrons, leading to the light emission. The light thus generated may pass through the second electrode 33, the second insulating layer 42, the adhesive layer 18, the color filter CF, and the second substrate 19, and extracted to the outside. This system is referred to as the "top emission".

Figure 9:
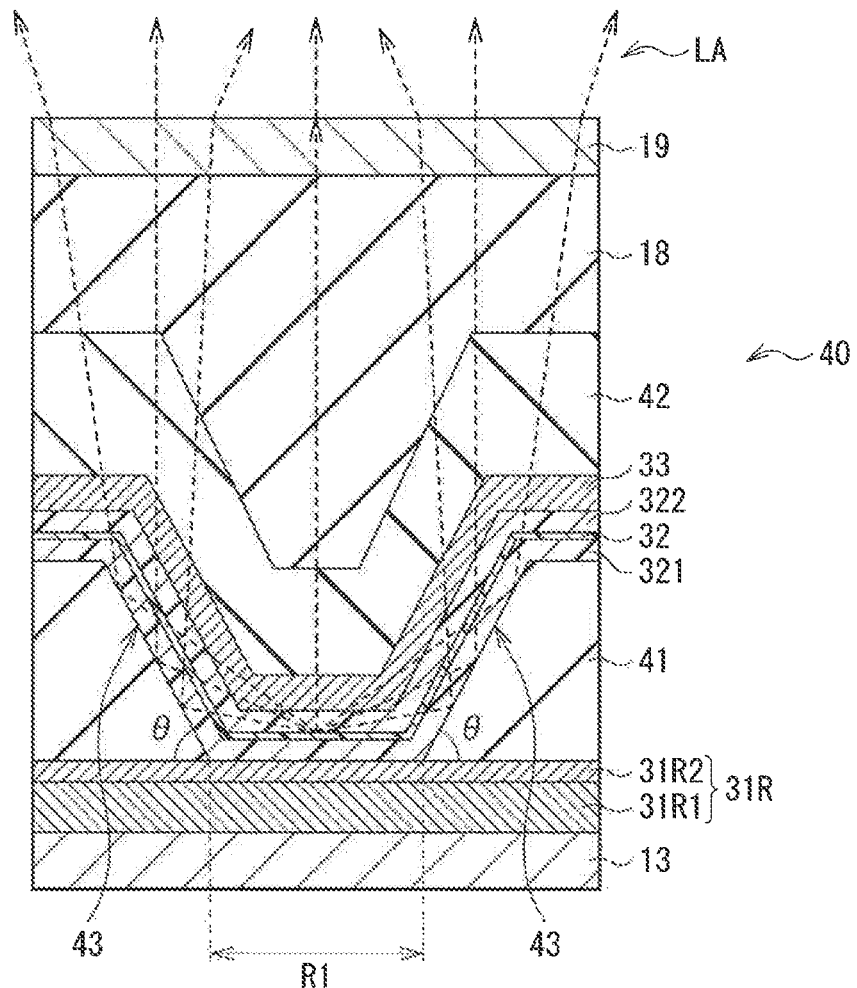
FIG. 9 describes light rays in the light guide illustrated in FIG. 6.
Figure 10:
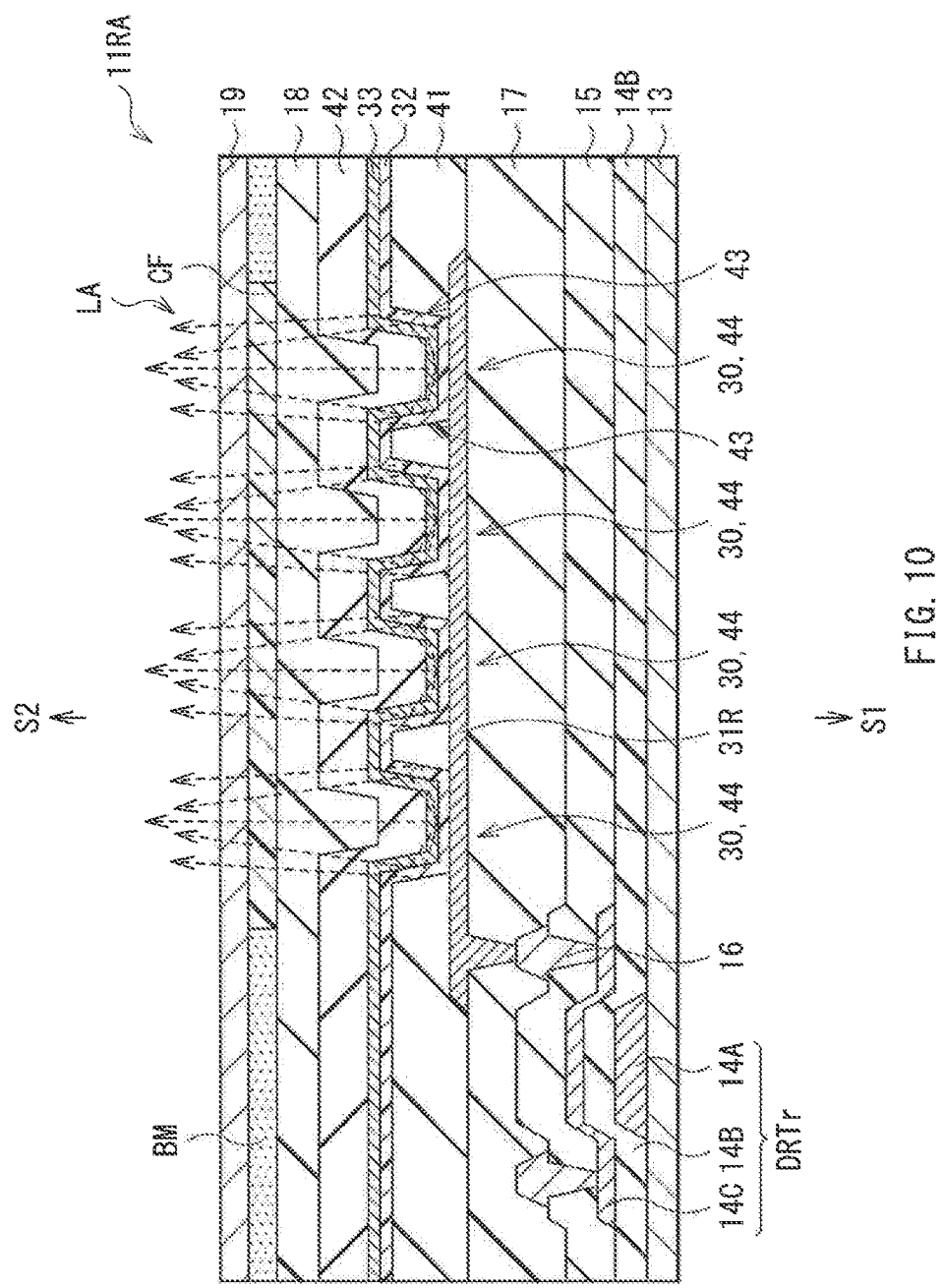
FIG. 10 describes light rays in the light-emission region illustrated in FIG. 5.

Here, the light guide 40 is provided on the side of the eight effective light-emitting parts 30 on which the light is extracted. Accordingly, as illustrated in FIGS. 9 and 10, light LA generated in the eight effective light-emitting parts 30 may be guided by the light guide 40 in the front direction. This leads to the enhancement in the light extraction efficiency of the light-emission regions 11RA, 11GA, and 11BA in the sub-pixels 11R, 11G and 11B. Thus, the display intensity of the light-emission regions 11RA, 11GA, and 11BA may be maintained, even in the case in which the light-emission regions 11RA, 11GA, and 11BA and the non-light-emission regions 11RB, 11GB, and 11BB are provided in the respective plurality of sub-pixels 11R, 11G and 11B.

Reference Example 1

Figure 11:
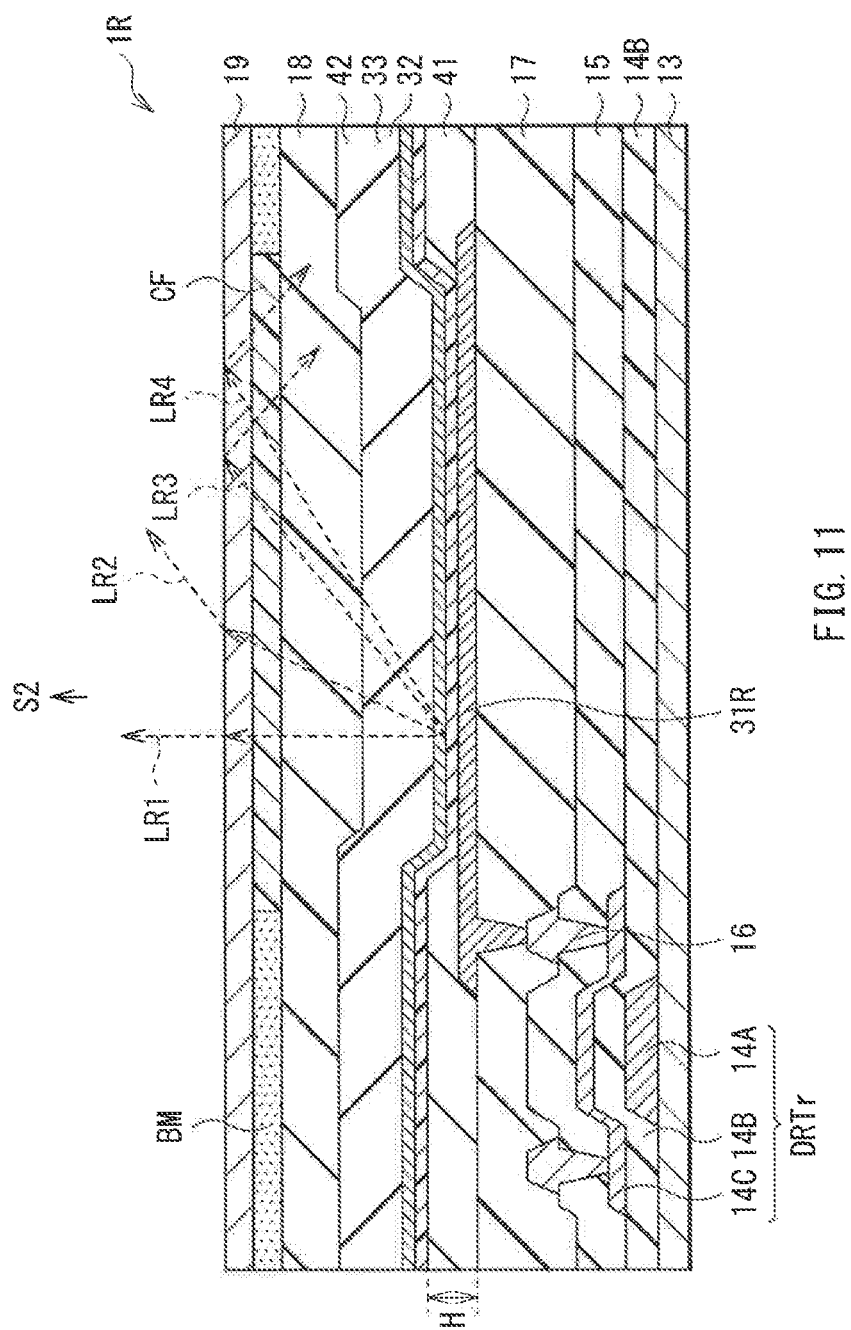
FIG. 11 describes light rays in a light-emission region of a sub-pixel of a display device according to Reference Example 1.

FIG. 11 describes light rays in the light-emission regions 11RA, 11GA, and 11BA of the sub-pixels 11R, 11G and 11B of a display device 1R according to Reference Example 1. Reference Example 1 may have a similar configuration to that of the forgoing embodiment, except that the effective light-emitting part 30 is provided over almost all of the light-emission regions 11RA, 11GA, and 11BA, and that Reference Example 1 is devoid of the light guide 40. In Reference Example 1, light LR1 emitted in a normal direction to the light emitting layer 32 may travel in the front direction. However, light LR2 emitted in a direction deviated from the normal direction may spread outward from the front direction. Light LR3 and LR4 emitted in directions more deviated from the normal direction may have possibility of being confined inside the display unit 10 by total reflection, or being blocked by the black matrix BM. In this case, a ratio of light extracted to the outside of the display unit 10 out of the light emitted from the light emitting layer 32 may be lowered. This contributes to lowered light extraction efficiency.

Examples 1-1 and 1-2

Figure 12:
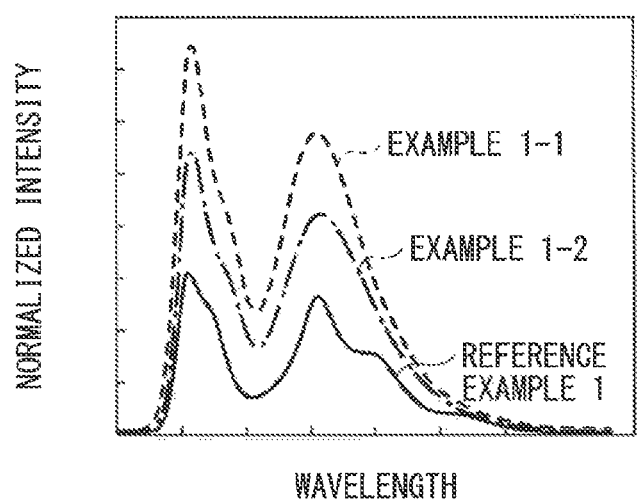
FIG. 12 describes results of Examples 1-1 and 1-2.

FIG. 12 describes results of experiments on investigation into the display intensity regarding each of the display devices 1 and 1R according to this embodiment (Examples 1-1 and 1-2) and Reference Example 1. It is to be noted that Examples 1-1 and 1-2 may have the same configurations as each other except for the taper angle θ (refer to FIG. 6.) of the reflector 43 with respect to the lower surface of the first insulating layer 41.

As seen from FIG. 12, in this embodiment in which the light guide 40 is provided on the side of the effective light-emitting parts 30 on which the light is extracted, Examples 1-1 and 1-2 both attained higher display intensity than that of Reference Example 1 devoid of the light guide 40. In other words, it was confirmed that providing the light guide 40 on the side of the effective light-emitting parts 30 on which the light was extracted brought the higher intensity, even in the case in which the light-emission regions 11RA, 11GA, and 11BA, and the non-light-emission regions 11RB, 11GB, and 11BB were provided in the sub-pixels 11R, 11G, and 11B.

As described, in this embodiment, the light-emission regions 11RA, 11GA, and 11BA, and the non-light-emission regions 11RB, 11GB, and 11BB are provided in the respective plurality of sub-pixels 11R, 11G, and 11B in the pixel Pix. In the light-emission regions 11RA, 11GA, and 11BA, the light guide 40 is provided on the side of the eight effective light-emitting parts 30 on which the light is extracted. Hence, it is possible to provide the non-light-emission regions 11RB, 11GB, and 11BB in the pixel Pix, i.e., the sub-pixels 11R, 11G, and 11B, while maintaining the display intensity of the light-emission regions 11RA, 11GA, and 11BA. Moreover, it is unnecessary to reduce the number of pixels in order to provide the non-light-emission regions 11RB, 11GB, and 11BB. It is therefore possible to avoid lowered definition caused by the reduction in the number of pixels.

Moreover, the non-light-emission regions 11RB, 11GB, and 11BB may have the light transparency. Hence, it is possible to provide the background transparency, and to display the image in the superimposed or merged relation to the background. This makes it possible to constitute the see-through display device, without limitation.

Furthermore, the bottom layer BL may be the reflection layer. Hence, it is possible to allow the bottom layer BL to reflect upward the light generated in the light emitting layer 32 and traveling downward. This makes it possible to enhance the light extraction efficiency, and to maintain or enhance the display intensity.

In addition, the circuit regions 50R, 50G and 50B may be provided under the first electrodes 31R, 31G and 31B of the light-emission regions 11RA, 11GA, and 11BA, so as to avoid the overlap with the non-light-emission regions 11RB, 11GB, and 11BB. Hence, it is possible to avoid degradation in the background transparency of the non-light-emission regions 11RB, 11GB, and 11BB.

In the following, description is given of modification examples (Modification Examples 1 to 8) of the forgoing embodiment.

Modification Example 1

Figure 13:
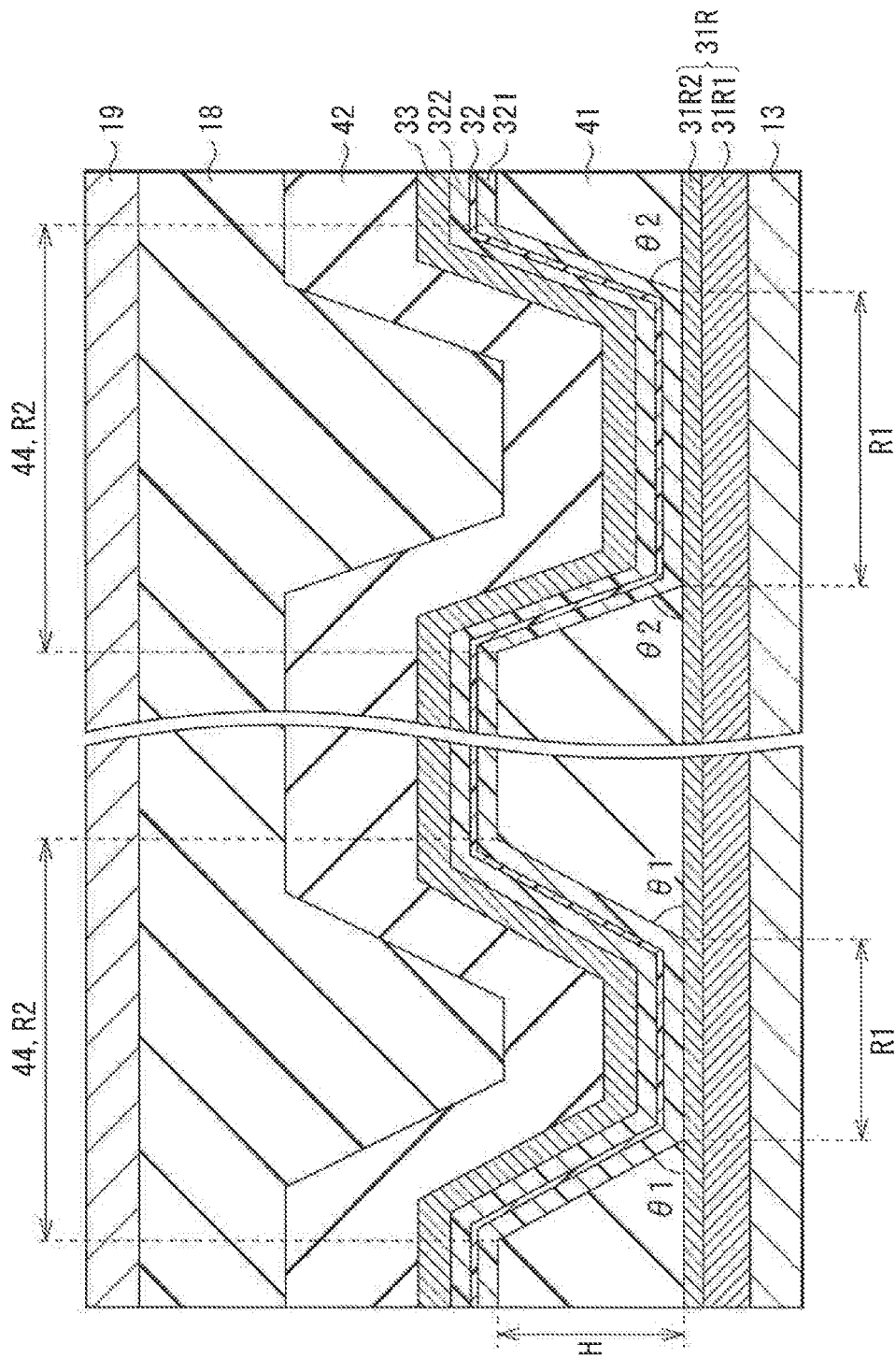
FIG. 13 is a cross-sectional view of one configuration example of effective light-emitting parts and a light guide in a light-emission region of a display device according to Modification Example 1.

In the forgoing embodiment, description is given on a case in which the light guide 40 may have the plurality of apertures 44, and the plurality of apertures 44 may have the same shapes in cross-section. However, as illustrated in FIG. 13, the plurality of apertures 44 may have different shapes in cross-section. In one specific and preferable, but non-limiting example, the plurality of apertures 44 may differ from one another in the taper angles θ1 and θ2 of the reflectors 43 with respect to the lower surface 41A of the first insulating layer 41. This makes it possible to restrain variations in reflection of external light. Control of the taper angle θ as described above may be made, for example but not limited to, in the patterning process of the first insulating layer 41, by adjustment of dimensions of the apertures 44 and an amount of exposure.

Examples 2-1, 2-2, and 2-3

Figure 14:
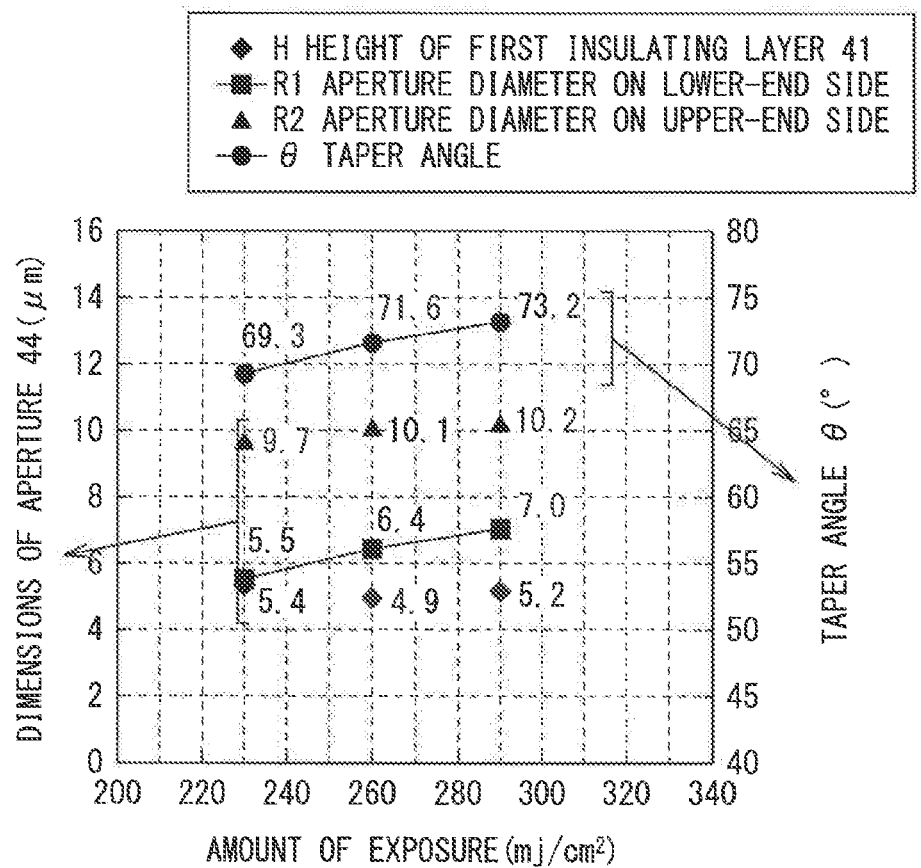
FIG. 14 describes results of Examples 2-1, 2-2, and 2-3.

FIG. 14 illustrates, regarding Modification Example 1 as described, an example in which the three apertures 44 are formed with the different taper angles θ from one another. In order to adjust the taper angles θ of the apertures 44, the dimensions of the apertures 44 and the amount of the exposure in the patterning process of the first insulating layer 41 were varied with Examples 2-1 to 2-3 as follows. In Example 2-1, the height H of the first insulating layer 41 was 5.4 μm. The aperture diameter R1 on the lower-end side of the aperture 44 was 5.5 μm. The aperture diameter R2 on the upper-end side of the aperture 44 was 9.7 μm. The amount of the exposure was 230 mj/cm$^2$. The taper angle θ thus obtained was 69.3°. In Example 2-2, the height H of the first insulating layer 41 was 4.9 μm. The aperture diameter R1 on the lower-end side of the aperture 44 was 6.4 μm. The aperture diameter R2 on the upper-end side of the aperture 44 was 10.1 μm. The amount of the exposure was 260 mj/cm$^2$. The taper angle θ thus obtained was 71.6°. In Example 2-3, the height H of the first insulating layer 41 was 5.2 μm. The aperture diameter R1 on the lower-end side of the aperture 44 was 7.0 μm. The aperture diameter R2 on the upper-end side of the aperture 44 was 10.2 μm. The amount of the exposure was 290 mj/cm$^2$. The taper angle θ thus obtained was 73.2°. As described, it is possible to easily vary the taper angle θ, with the adjustment of the dimensions of the apertures 44 and the amount of the exposure in the patterning process of the first insulating layer 41 in the method of manufacture according to the forgoing embodiment.

It is to be noted that the plurality of apertures 44 may not have different taper angles θ, as long as the plurality of apertures 44 differ in the cross-sectional shapes. For example, the plurality of apertures 44 may have the same taper angles θ but differ in the height H of the first insulating layer 41, or the aperture diameter R1 or R2, or any combination thereof.

Otherwise, the display device 1 according this modification example may have similar configurations, workings, and effects to those of the display device 1 according to the forgoing embodiment. The display device 1 according to this modification example may be manufactured in a similar manner to the forgoing embodiment.

Modification Example 2

Figure 15:
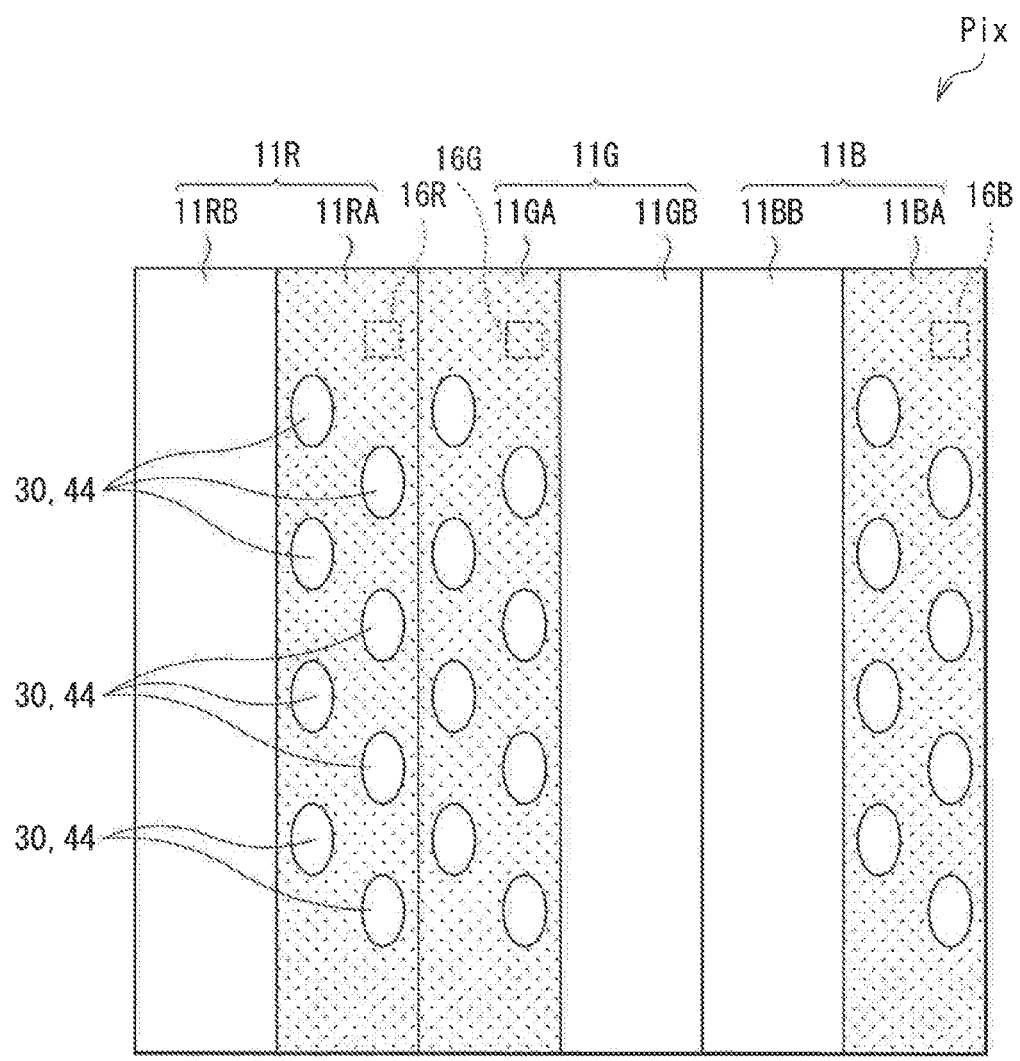
FIG. 15 is a plan view of one arrangement example of effective light-emitting parts and a light guide in a light-emission region of a display device according to Modification Example 2.

In the forgoing embodiment, description is given on a case in which the planar shapes of the plurality of effective light-emitting parts 30 or the plurality of apertures 44 may be circles. However, as illustrated in FIG. 15, the planar shapes of the plurality of effective light-emitting parts 30 or the plurality of apertures 44 may be eclipses. This allows the plurality of effective light-emitting parts 30 or the plurality of apertures 44 to be enlarged in a direction of longer axes of the eclipses, allowing for effective utilization of space of the light-emission regions 11RA, 11GA, and 11BA. Moreover, it is possible to increase area of each of the plurality of effective light-emitting parts 30 or the plurality of apertures 44, leading to a higher aperture ratio. Furthermore, it is possible to form the light emitting layer 32 and the second electrode 33 more uniformly in the manufacturing process.

Figure 16:
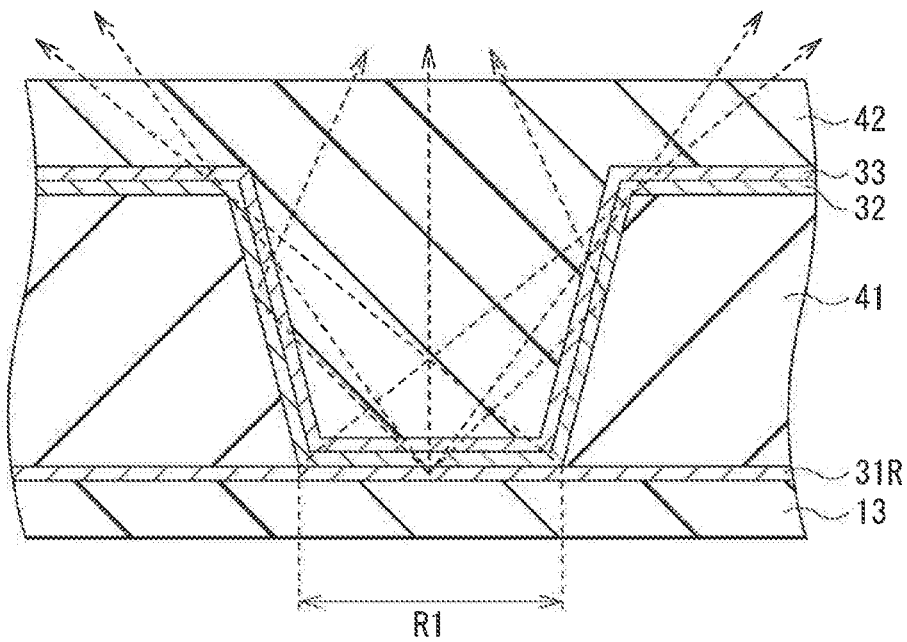
FIG. 16 describes light rays in the light guide illustrated in FIG. 15.
Figure 17:
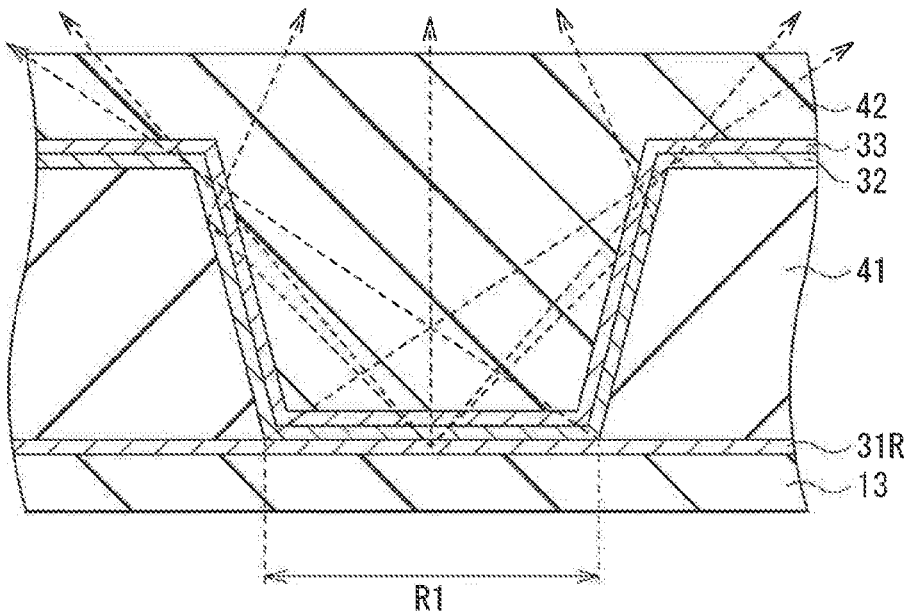
FIG. 17 also describes light rays in the light guide illustrated in FIG. 15.

In addition, allowing the plurality of effective light-emitting parts 30 or the plurality of apertures 44 to be shaped as the eclipses makes it possible to expand a view angle in a specific direction. For example, as illustrated in FIGS. 16 and 17, in the direction of the longer axes (refer to FIG. 17), light may spread in a direction more deviated from the normal direction, than in a direction of shorter axes (refer to FIG. 16). Accordingly, it is possible to expand the view angle in a direction of orientations of the plurality of effective light-emitting parts 30 or the plurality of apertures 44, e.g., the direction of the longer axes.

Otherwise, the display device 1 according to this modification example may have similar configurations, workings, and effects to those of the display device 1 according to the forgoing embodiment. The display device 1 according to this modification example may be manufactured in a similar manner to the forgoing embodiment.

Modification Example 3

Figure 18:
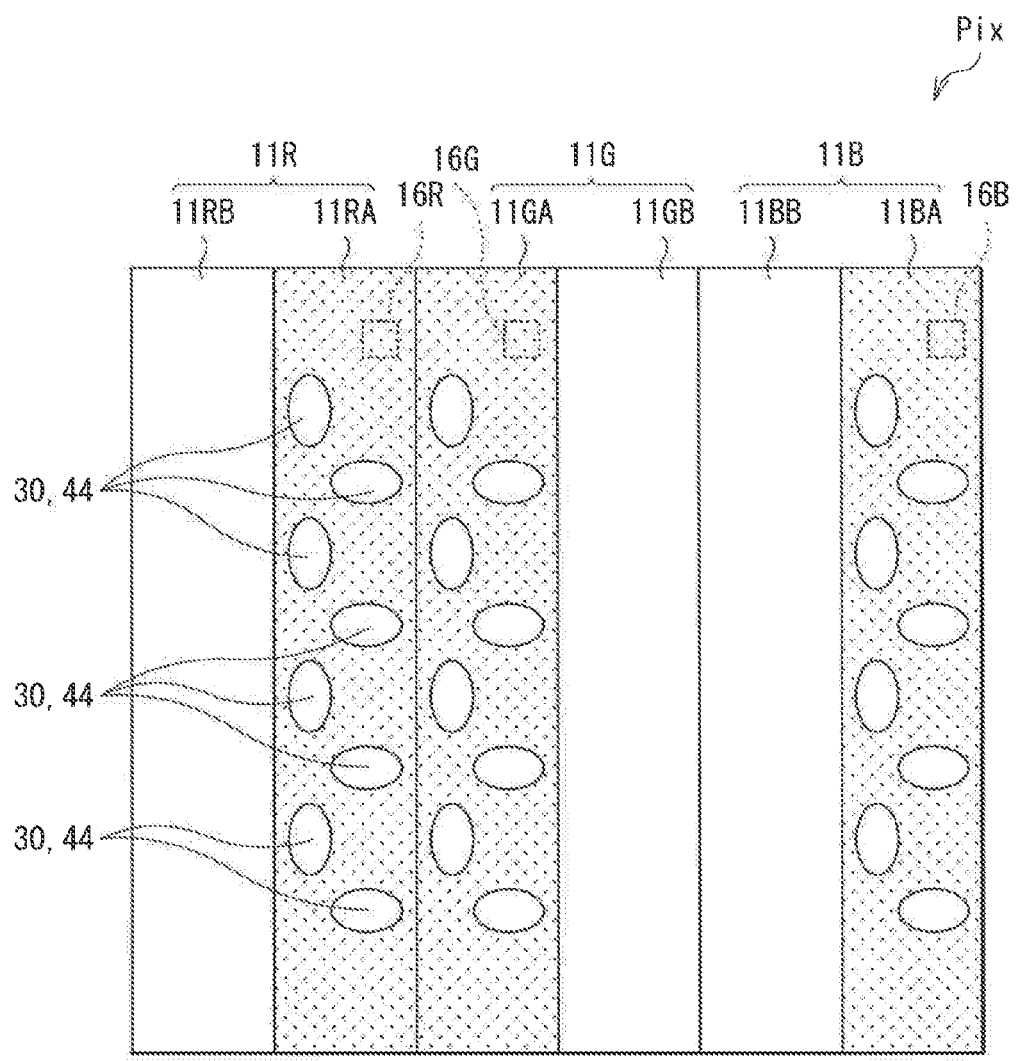
FIG. 18 is a plan view of one arrangement example of effective light-emitting parts and a light guide in a light-emission region of a display device according to Modification Example 3.

Furthermore, in Modification Example 2, as illustrated in FIG. 18, the plurality of effective light-emitting parts 30 or the plurality of apertures 44 may be eclipses that differ in the directions of the longer axes. Allowing the eclipses to have different orientations as described above makes it possible to expand the view angle both vertically and horizontally.

Modification Example 4

Figure 19:
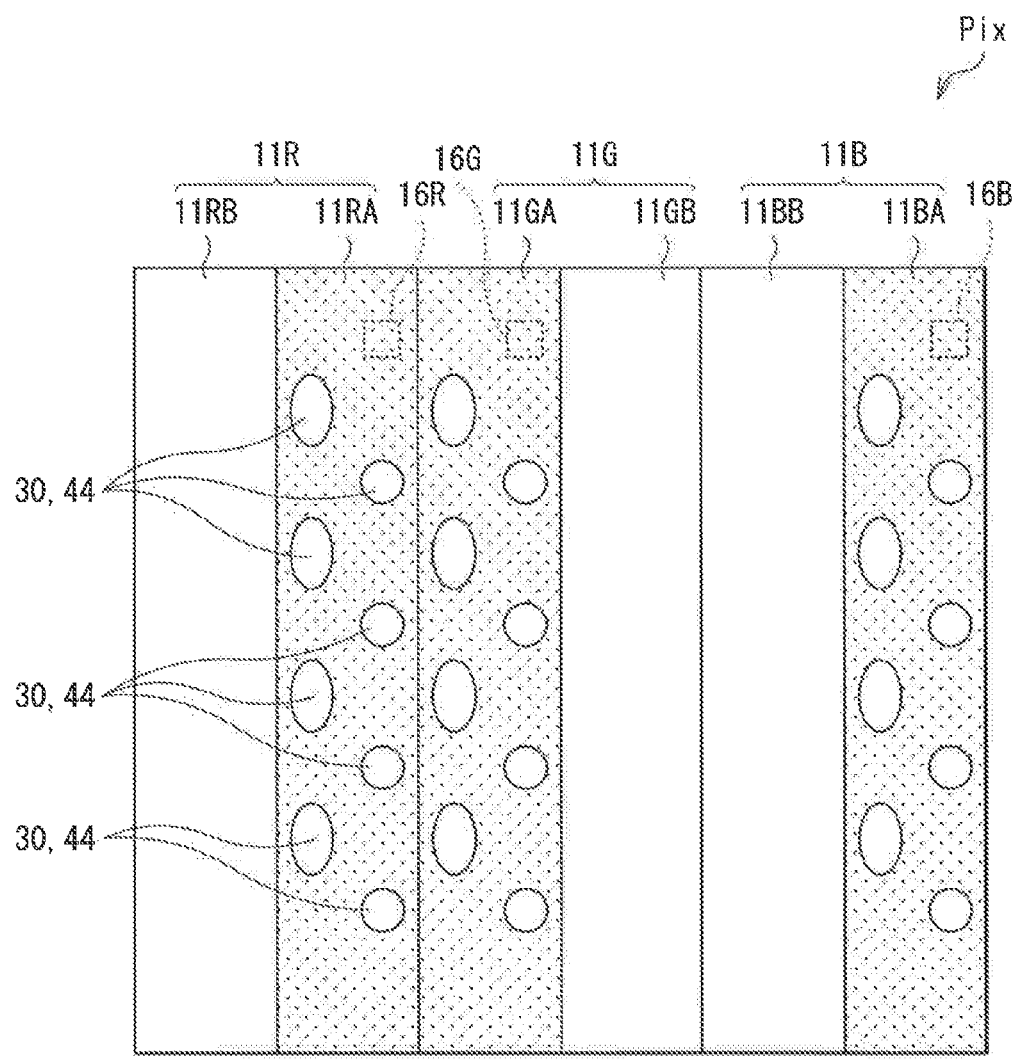
FIG. 19 is a plan view of one arrangement example of effective light-emitting parts and a light guide in a light-emission region of a display device according to Modification Example 4.

In addition, in Modification Example 2, the planar shapes of the plurality of effective light-emitting parts 30 or the plurality of apertures 44 may be different from one another. For example, as illustrated in FIG. 19, the plurality of effective light-emitting parts 30 or the plurality of apertures 44 may be circles and eclipses. In this case, it is possible to produce the effects of both the forgoing embodiment and Modification Example 2 as described.

Furthermore, in this modification example, the eclipses may have the different orientations, as with Modification Example 3. This makes it possible to additionally produce the effects of Modification Example 3 as described.

Modification Example 5

Figure 20:
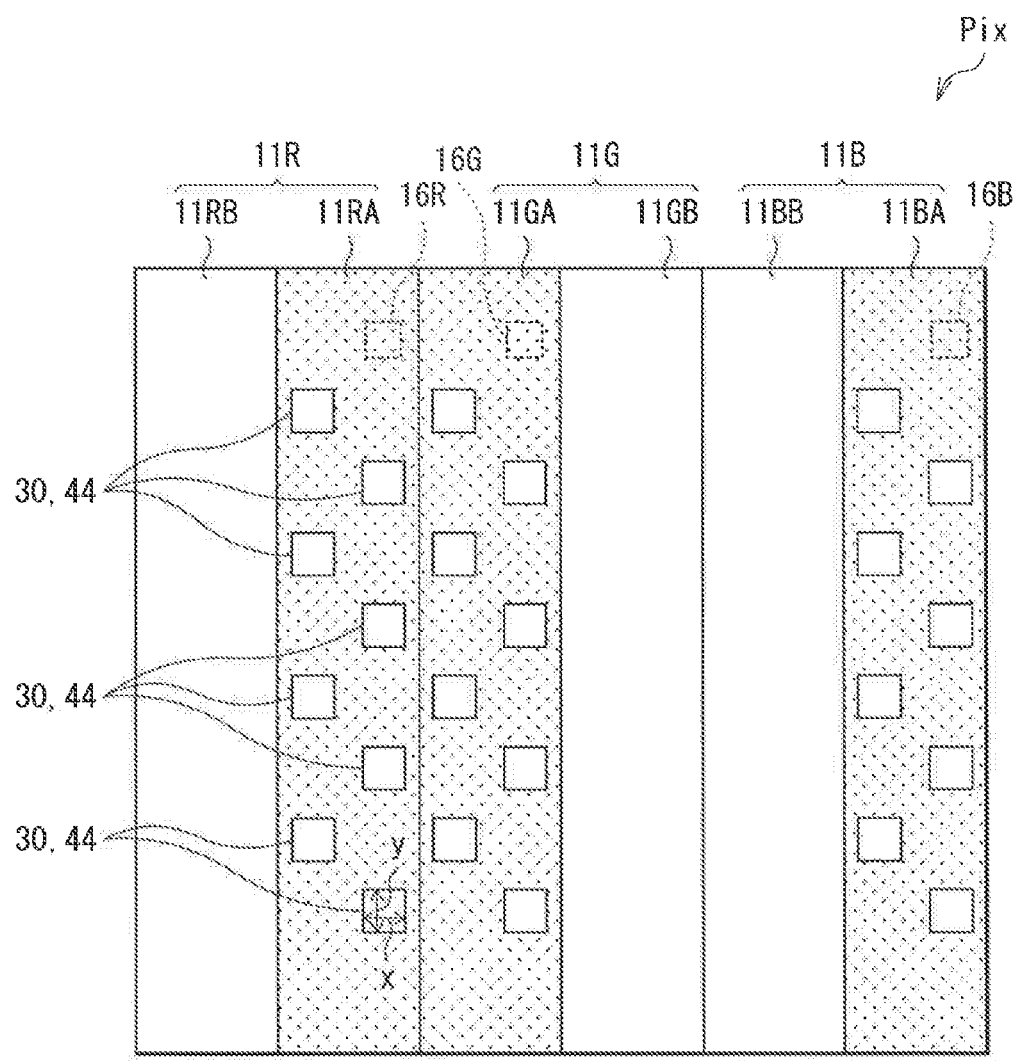
FIG. 20 is a plan view of one arrangement example of effective light-emitting parts and a light guide in a light-emission region of a display device according to Modification Example 5.

In addition, the planar shapes of the plurality of effective light-emitting parts 30 or the plurality of apertures 44 are not limited to the circles and the eclipses, but may be other shapes. For example, as illustrated in FIG. 20, the plurality of effective light-emitting parts 30 or the plurality of apertures 44 may be quadrangles such as squares or rectangles. Moreover, corners of the quadrangles may be rounded.

In this case, in one preferable but non-limiting example, an interval of opposite sides, i.e., x and y in FIG. 20 may be utilized, instead of the aperture diameters R1 and R2 of the apertures 44 in Expressions 3 and 4. In one specific and preferable, but non-limiting example, an interval x1 on the lower-end side of the aperture 44 and an interval x2 on the upper-end side of the aperture 44 may satisfy Expressions 5 and 6 as follows. In one preferable but non-limiting example, an interval y1 on the lower-end side of the aperture 44 and an interval y2 on the upper-end side of the aperture 44 may satisfy Expressions 7 and 8 as follows.

$$x1/x2<1 \quad \text{(Expression 5)}$$

$$0.5 \leq H/x1 \leq 2.0 \quad \text{(Expression 6)}$$

$$y1/y2<1 \quad \text{(Expression 7)}$$

$$0.5 \leq H/y1 \leq 2.0 \quad \text{(Expression 8)}$$

Furthermore, the plurality of effective light-emitting parts 30 or the plurality of apertures 44 may be quadrangles that differ in longitudinal directions. Allowing the quadrangles to have different orientations as described above makes it possible to expand the view angle both vertically and horizontally.

Modification Example 6

Figure 21:
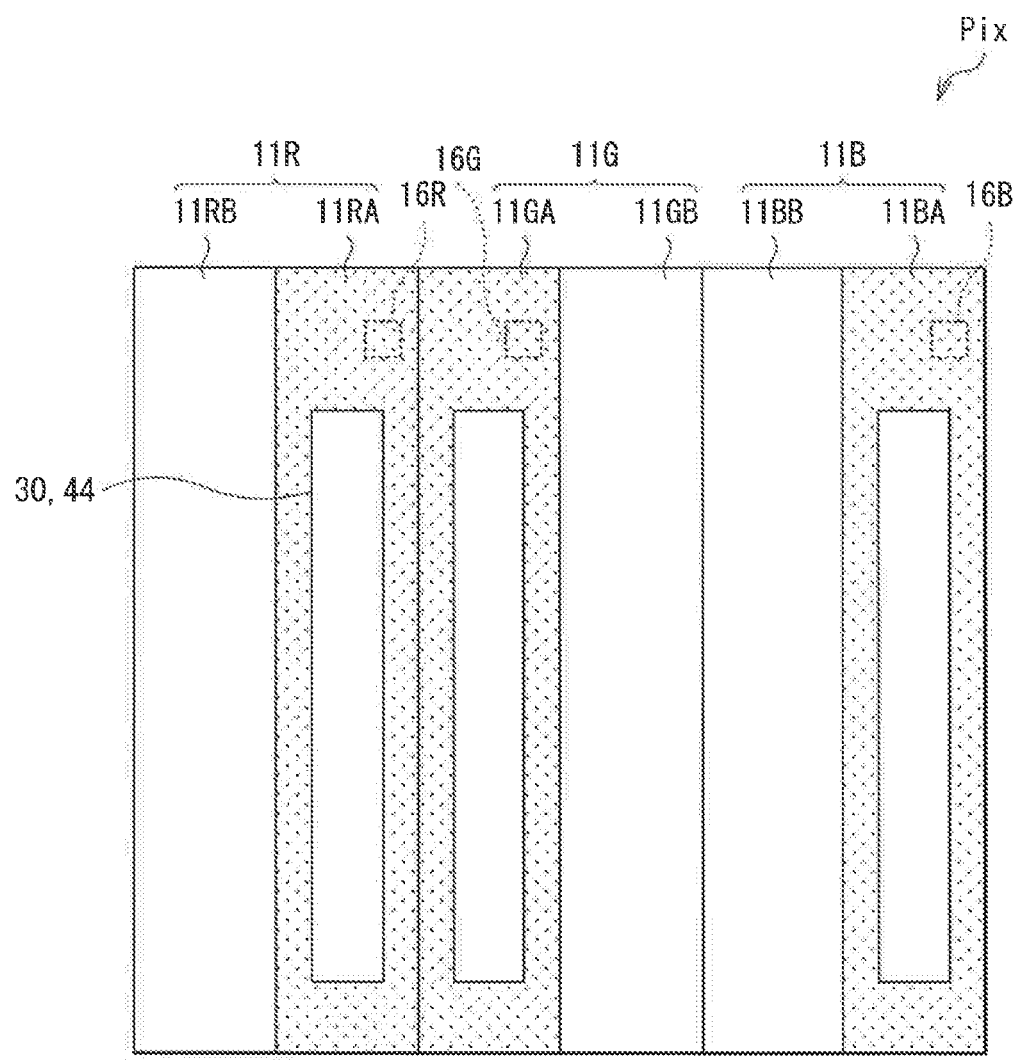
FIG. 21 is a plan view of one arrangement example of effective light-emitting parts and a light guide in a light-emission region of a display device according to Modification Example 6.

In the forgoing embodiment, description is given on a case in which each of the light-emission regions 11RA, 11GA, and 11BA may include the plurality of effective light-emission regions 30. However, as illustrated in FIG. 21, each of the light-emission regions 11RA, 11GA, and 11BA may include the single effective light-emitting part 30.

Modification Example 7

Figure 22:
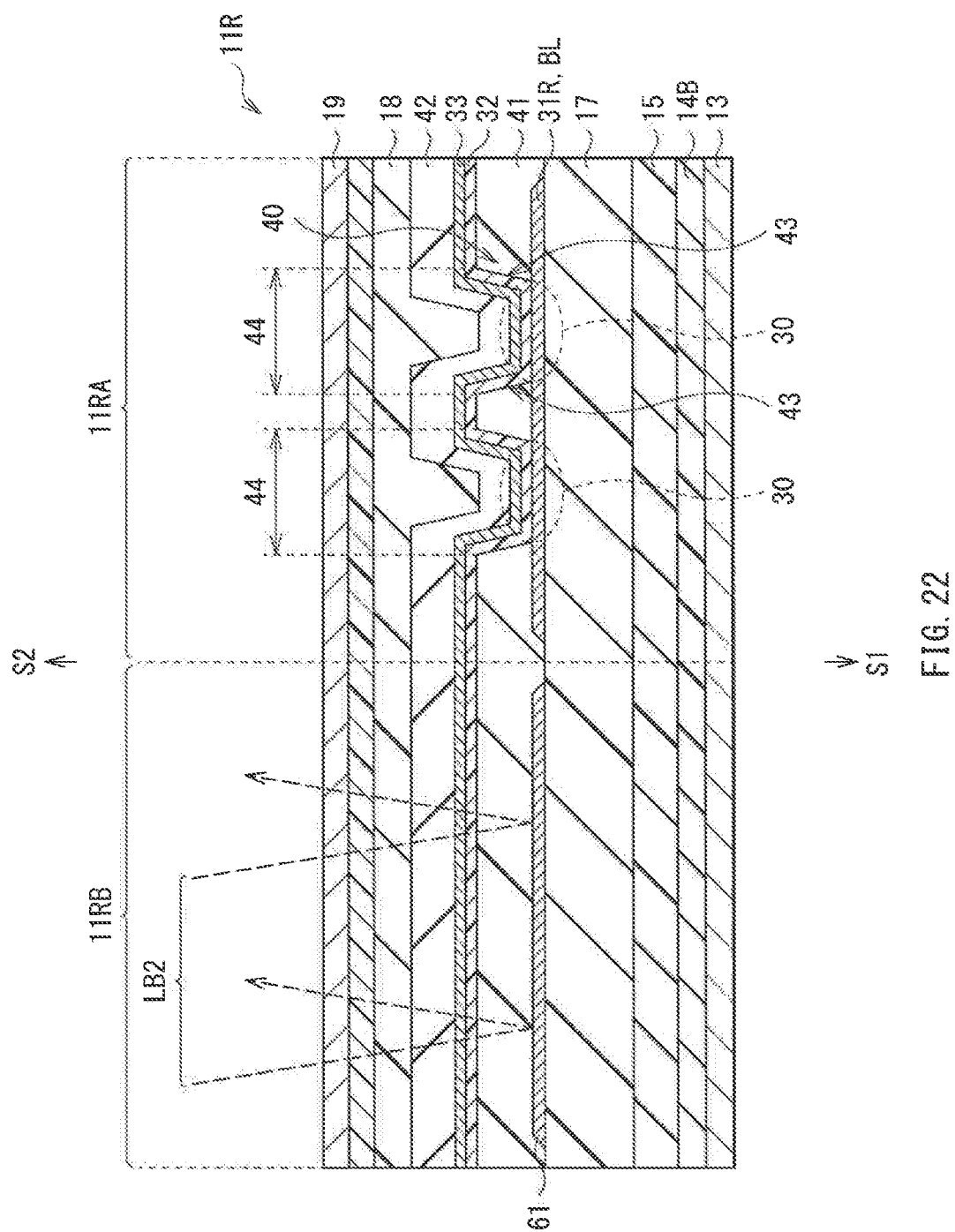
FIG. 22 is a cross-sectional view of one configuration example of a light-emission region and a non-light-emission region in a sub-pixel of a display device according to Modification Example 7.

In the forgoing embodiment, description is given on a case in which the non-light-emission regions 11RB, 11GB, and 11BB may have the light transparency. However, as illustrated in FIG. 22, the non-light-emission regions 11RB, 11GB, and 11BB may include a reflection film 61. This makes it possible to provide a reflection display device 1C that allows the reflection film 61 to reflect external light LB2. The reflection film 61 may be level with the first electrodes 31R, 31G and 31B, and made of the same material as that of the first electrodes 31R, 31G and 31B, in a case in which, for example, the first electrodes 31R, 31G and 31B are the reflection electrodes as described in the forgoing embodiment.

Modification Example 8

Figure 23:
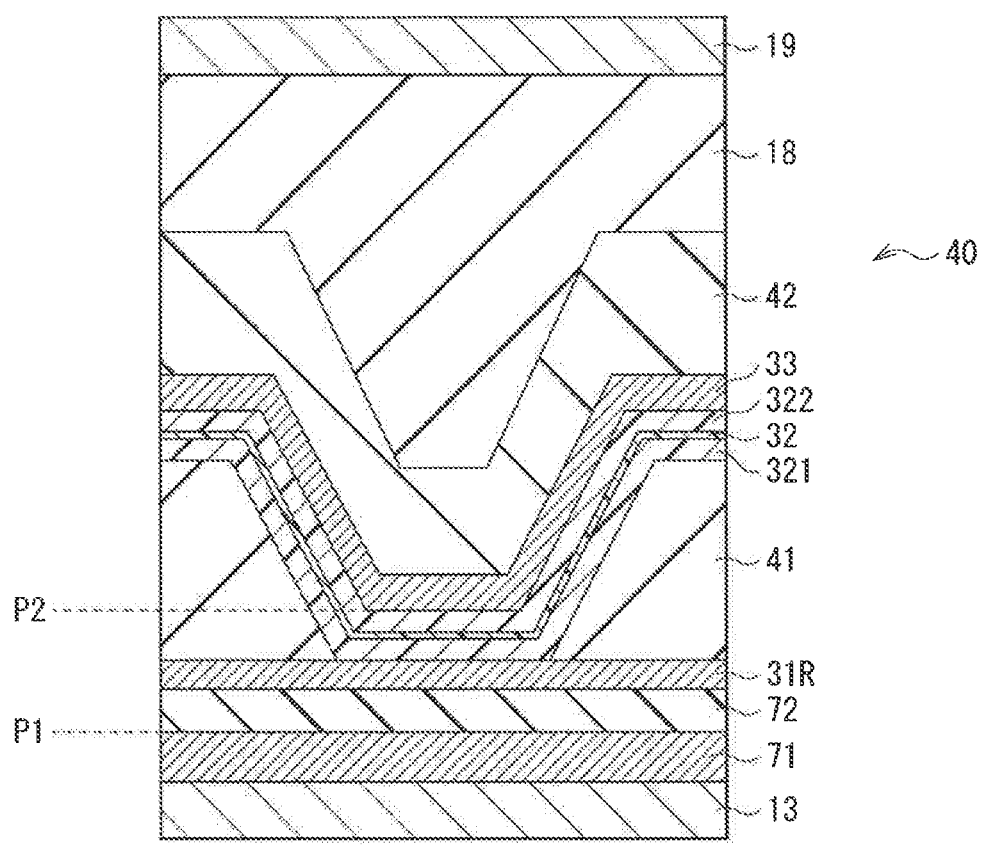
FIG. 23 is a cross-sectional view of one configuration example of an effective light-emitting part in a light-emission region of a display device according to Modification Example 8.

In the forgoing embodiment, description is given on a case in which the first electrodes 31R, 31G, and 31B are the reflection electrodes. However, as illustrated in FIG. 23, the first electrodes 31R, 31G and 31B may be transparent layers. A reflection layer 71 may be provided under the first electrodes 31R, 31G and 31B. An insulating film 72 may be interposed between the first electrodes 31R, 31G, and 31B, and the reflection layer 71. This makes it possible to allow the reflection layer 71 to reflect upward the light generated in the light emitting layer 32 and traveling downward. Accordingly, it is possible to increase the light extraction efficiency, and to maintain or enhance the display intensity.

Furthermore, the light-emission regions 11RA, 11GA, and 11BA may include a first reflection plane P1 and a second reflection plane P2. In this case, the second electrode 33 may be a semi-transparent electrode. The first reflection plane P1 may be, for example, a surface of the reflection layer 71 on which the light emitting layer 32 is disposed. The second reflection plane P2 may be, for example, a surface of the second electrode 33 on which the light emitting layer 32 is disposed. This makes it possible to constitute a cavity structure that causes the light generated in the light emitting layer 32 to oscillate between the reflection layer 71 and the second electrode 33, and to be extracted from side on which the second electrode 33 is disposed. Providing such a cavity structure makes it possible to cause multiple interference of the light generated in the light emitting layer 32, and to reduce a half-value width of a spectrum of light extracted from the side on which the second electrode 33 is disposed, leading to higher peak intensity. In other words, it is possible to increase intensity of light radiation in the front direction, and to enhance color purity of the light emission. It is to be noted that in a case in which the second electrode 33 is the semi-transparent reflection electrode, the second electrode 33 may have a thickness of, for example, 5 nm or less, and be constituted by a thin metal film made of Mg—Ag, without limitation.

Moreover, in this modification example, a thickness of the insulating film 72 may be adjusted, so as to provide optical distances LR, LG, and LB that differ in accordance with display colors. The optical distances LR, LG and LB may be optical distances from the first reflection plane P1 to the second reflection plane P2 in the respective three sub-pixels 11R, 11G, and 11B. This makes it possible to cause oscillation solely of a desired color component to be extracted out of the white light generated in the light emitting layer 32, and to extract the oscillated color component from side on which the second reflection plane P2 is disposed.

Positions of the first reflection plane P1 and the second reflection plane P2 are not limited to the example as described above. For example, in a case in which the first electrodes 31R, 31G, and 31B are the semi-transparent reflection layers, the first reflection plane P1 may be the surface of the reflection layer 71 on the side on which the light emitting layer 32 is disposed. The second reflection plane P2 may be the surface of the first electrodes 31R, 31G, and 31B on side on which the reflection layer 71 is disposed, or the surface of the first electrodes 31R, 31G and 31B on the side on which the light emitting layer 32 is disposed. It is to be noted that the second electrode 33 may be a transparent electrode, and the cavity structure may be eliminated.

Application Example 1

Figure 24:
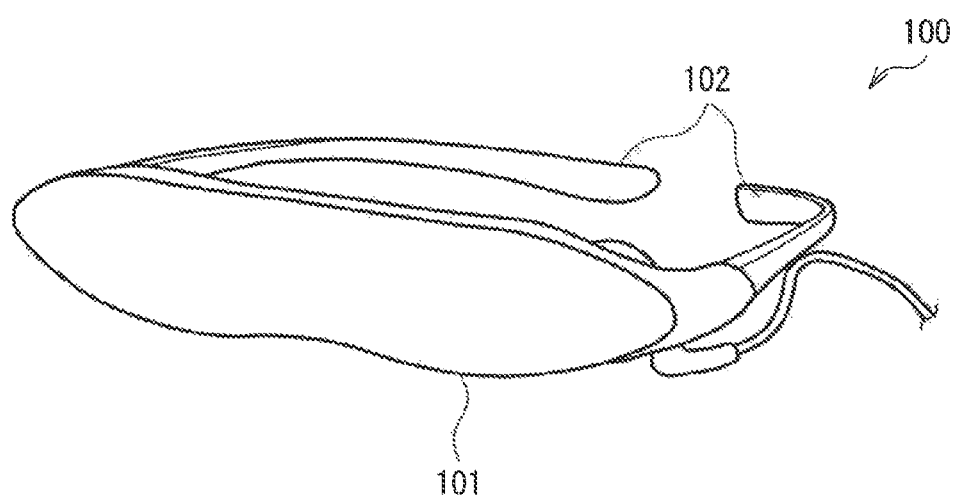
FIG. 24 is a perspective view of an external appearance of Application Example 1.

FIG. 24 illustrates an external appearance of a head mount display 100 to which the display device 1 according to the forgoing embodiment is applied. The head mount display 100 may include, for example, a display unit 101 and ear hook units 102 on both sides of the display unit 101. The display unit 101 may be shaped as a pair of spectacles. The ear hook units 102 may allow for wear on a head of a user. The display unit 101 may be constituted by the display device 1 according to the forgoing embodiment.

In the head mount display 100, image display may be performed by the display device 1 according to the forgoing embodiment.

The display device 1 according to the forgoing embodiment, as the see-through display device, may have a wide range of applications including a signage display, a car navigation device, a monitor device for medical use, commercial applications such as shops, in addition to the head mount display as described in Application Example 1.

Although description has been made by giving example embodiments as mentioned above, the contents of the disclosure are not limited to the above-mentioned example embodiments and may be modified in a variety of ways. For example, in the forgoing embodiment, description is given on a case in which the reflector 43 on the side surface of the aperture 44 may be constituted by the reflection interface with the utilization of the difference between the refractive indexes of the first insulating layer 41 and the second insulating layer 42. However, the reflector 43 may be constituted by a metal film that is provided on the side surface of the aperture 44 and serves as a mirror surface.

For example, in the forgoing embodiment, description is given on specific examples of the configurations of the display device 1. However, the display device 1 is not limited to a display device including all of the depicted components. Some of the components may be replaced with another component or other components.

In the forgoing embodiment, description is given on specific examples of the circuit configurations and operation of the driver unit 20. However, the circuit configurations for active-matrix drive are not limited to as described in the forgoing embodiment. Additional capacitors or transistors may be provided as necessary. Coupling relation may be altered. In this case, in association with the changes in the circuit configurations, additional driver circuits may be provided in addition to the driver unit 20 as described. It is to be appreciated that the drive method and the operation of the driver unit 20 is not limited to as described in the forgoing embodiment, but may be modified as appropriate.

Materials and thicknesses of each layer, deposition methods and deposition conditions, or other features as described in the forgoing embodiment are non-limiting. Any other material, any other thickness, any other deposition method, or any other deposition conditions may be employed.

The light emitting layer 32 may be formed not only by coating methods such as a vacuum deposition method or an ejection coating method, but also by other coating methods or by printing methods. Non-limiting examples of the coating methods may include a dipping method, a doctor blade method, a spin coating method, a spray coating method. Non-limiting examples of the printing methods may include an inkjet method, an offset printing method, a letterpress printing method, an intaglio printing method, a screen printing method, and a micro gravure coating method. A dry process and a wet process may be utilized in combination, depending on properties of each layer of the light emitting layer 32 or each component.

Furthermore, in the forgoing embodiment, description is given on a solid sealing structure in which the effective light-emitting parts 30 may be covered with the second insulating layer 42, the adhesive layer 18, and the second substrate 19, with no vacancy left between the second insulating layer 42 and the second substrate 19. However, a hollow sealing structure may be also employed in which the effective light-emitting parts 30 may be covered with the second insulating layer 42 and an undepicted lid member, with vacancy left between the second insulating layer 42 and the lid member. In this case, an undepicted getter agent may be disposed in the vacancy between the second insulating layer 42 and the lid member, so as to restrain moisture from intruding into the light emitting layer 32.

In the forgoing embodiment, description is given on a case of an upper-surface emission system, i.e., the top emission system in which the light generated in the light emitting layer 32 is extracted from the side on which the second electrode 33 is disposed. In one alternative, however, a lower-surface emission system, i.e., a bottom emission system may be employed in which the light generated in the light emitting layer 32 is extracted from side on which the first electrodes 31R, 31G and 31B are disposed, i.e., from side on which the first substrate 13 is disposed.

In the forgoing embodiment, description is given on a case in which the effective light-emitting parts 30 may include the first electrodes 31R, 31G and 31B, i.e., the anodes, the light emitting layer 32, and the second electrode 33, i.e., the cathode, in the order named from the side on which the first substrate 13 is disposed. However, the first electrodes 31R, 31G, and 31B, i.e., the anodes and the second electrode 33, i.e., the cathode may switch positions with each other. In other words, the effective light-emitting parts 30 may include the second electrode 33, i.e., the cathode, the light emitting layer 32, and the first electrodes 31R, 31G and 31B, i.e., the anodes, in the order named from the side on which the first substrate 13 is disposed. In this case as well, either the upper-surface emission system, i.e., the top emission system or the lower-surface emission system i.e., the bottom emission system may be employed. In the upper-surface emission system, the light is extracted from the side on which the first electrodes 31R, 31G, and 31B, i.e., the anodes are disposed. In the lower-surface emission system, the light is extracted from the side on which the second electrode 33, i.e., the cathode is disposed, i.e., from the side on which the first substrate 13 is disposed.

It is to be noted that effects described herein are merely exemplified. Effects of the technology are not limited to the effects described herein. Effects of the technology may further include other effects than the effects described herein.

It is to be noted that the technology may also have the following configurations.

(1)
A display device, including a pixel including a plurality of sub-pixels,
each of the plurality of sub-pixels including:
a light-emission region; and
a non-light-emission region other than the light-emission region, and
the light-emission region including
one or more effective light-emitting parts in which a first electrode, a light emitting layer, and a second electrode are stacked in order, and
a light guide provided on side of the one or more effective light-emitting parts on which light is extracted.

(2)
The display device according to (1), in which
the light guide includes:
a first insulating layer that has one or more apertures confronted with the respective one or more effective light-emitting parts; and
a reflector provided on a side surface of each of the one or more apertures.

(3)
The display device according to (2), in which
the light-emission region includes a bottom layer at lower ends of the one or more apertures, the bottom layer being common to the one or more effective light-emitting parts, and
the bottom layer is provided in the light-emission region, to avoid overlap with the non-light-emission region.

(4)
The display device according to (3), in which
the bottom layer is a reflection layer.

(5)
The display device according to (3), in which
the bottom layer is a transparent layer or a semi-transparent reflection layer.

(6)
The display device according to (5), in which
the light-emission region includes a reflection layer, under the bottom layer, with an insulating film in between.

(7)
The display device according to (6), in which
the second electrode is constituted by a transparent electrode.

(8)
The display device according to (6), in which
the plurality of sub-pixels differ from one another in display colors,
the light-emission region includes a first reflection plane and a second reflection plane, and
optical distances from the first reflection plane to the second reflection plane in the plurality of sub-pixels differ from one another in accordance with the display colors.

(9)
The display device according to (8), in which
the second electrode is a semi-transparent reflection electrode, and
the first reflection plane is a surface of the reflection layer on side on which the light emitting layer is disposed, and the second reflection plane is a surface of the second electrode on the side on which the light emitting layer is disposed.

(10)
The display device according to any one of (3) to (9), in which
the bottom layer serves as the first electrode,
the first insulating layer is provided between the first electrode, and the light emitting layer and the second electrode, and
the one or more effective light-emitting parts are parts in which the light emitting layer and the second electrode are stacked on the first electrode at bottoms of the respective one or more apertures.

(11)
The display device according to any one of (1) to (10), in which
the non-light-emission region has light transparency.

(12)

The display device according to (11), in which
each of the plurality of sub-pixels further includes a circuit region, and
the circuit region is provided under the first electrode, to avoid overlap with the non-light-emission region.

(13)

The display device according to any one of (1) to (12), in which
the non-light-emission region includes a reflection film.

(14)

The display device according to any one of (2) to (12), in which
each of the one or more apertures is shaped as a truncated cone,
a height H of the first insulating layer, an aperture diameter R1 on lower-end side of the aperture, and an aperture diameter R2 on upper-end side of the aperture satisfy Expression 1 and Expression 2 as follows.

$$R1/R2<1.0 \qquad \text{(Expression 1)}$$

$$0.5 \leq H/R1 \leq 2.0 \qquad \text{(Expression 2)}$$

(15)

The display device according to any one of (2) to (14), in which
the one or more apertures include a plurality of apertures, and
the plurality of apertures differ from one another in a taper angle of the reflector with respect to a lower surface of the first insulating layer.

(16)

The display device according to any one of (1) to (15), in which
the one or more effective light-emitting parts include a plurality of effective light-emitting parts, and
the plurality of effective light-emitting parts differ in planar shapes.

(17)

The display device according to any one of (1) to (16), in which
shapes of the one or more effective light-emitting parts are circles or eclipses.

(18)

The display device according to (17), in which
the one or more effective light-emitting parts include a plurality of effective light-emitting parts, and
the plurality of effective light-emitting parts differ in directions of long axes of the eclipses.

(19)

The display device according to any one of (1) to (16), in which
shapes of the one or more effective light-emitting parts are quadrangles.

(20)

An electronic apparatus, including a display device,
the display device including a pixel including a plurality of sub-pixels,
each of the plurality of sub-pixels including:
a light-emission region; and
a non-light-emission region other than the light-emission region, and
the light-emission region including
one or more effective light-emitting parts in which a first electrode, a light emitting layer, and a second electrode are stacked in order, and
a light guide provided on side of the one or more effective light-emitting parts on which light is extracted.

Although the technology has been described in terms of exemplary embodiments, it is not limited thereto. It should be appreciated that variations may be made in the described embodiments by persons skilled in the art without departing from the scope of the technology as defined by the following claims. The limitations in the claims are to be interpreted broadly based on the language employed in the claims and not limited to examples described in this specification or during the prosecution of the application, and the examples are to be construed as non-exclusive. For example, in this disclosure, the term "preferably" or the like is non-exclusive and means "preferably", but not limited to. The use of the terms first, second, etc. do not denote any order or importance, but rather the terms first, second, etc. are used to distinguish one element from another. The term "about" as used herein can allow for a degree of variability in a value or range. Moreover, no element or component in this disclosure is intended to be dedicated to the public regardless of whether the element or component is explicitly recited in the following claims.

What is claimed is:

1. A display device, comprising a pixel including a plurality of sub-pixels,
each of the plurality of sub-pixels including:
a light-emission region; and
a non-light-emission region other than the light-emission region, and
the light-emission region including
one or more effective light-emitting parts in which a first electrode, a light emitting layer, and a second electrode are stacked in order, and
a light guide provided on side of the one or more effective light-emitting parts on which light is extracted, wherein the light guide includes:
a first insulating layer that has one or more apertures confronted with the respective one or more effective light-emitting parts, wherein the one or more apertures extend through the light guide; and
a reflector provided on a side surface of each of the one or more apertures.

2. The display device according to claim 1, wherein
the light-emission region includes a bottom layer at lower ends of the one or more apertures, the bottom layer being common to the one or more effective light-emitting parts, and
the bottom layer is provided in the light-emission region, to avoid overlap with the non-light-emission region.

3. The display device according to claim 2, wherein
the bottom layer is a reflection layer.

4. The display device according to claim 2, wherein
the bottom layer is a transparent layer or a semi-transparent reflection layer.

5. The display device according to claim 4, wherein
the light-emission region includes a reflection layer, under the bottom layer, with an insulating film in between.

6. The display device according to claim 5, wherein
the second electrode is constituted by a transparent electrode.

7. The display device according to claim 5, wherein
the plurality of sub-pixels differ from one another in display colors,
the light-emission region includes a first reflection plane and a second reflection plane, and optical distances from the first reflection plane to the second reflection plane in the plurality of sub-pixels differ from one another in accordance with the display colors.

8. The display device according to claim 7, wherein
the second electrode is a semi-transparent reflection electrode, and
the first reflection plane is a surface of the reflection layer on side on which the light emitting layer is disposed, and the second reflection plane is a surface of the second electrode on the side on which the light emitting layer is disposed.

9. The display device according to claim 2, wherein
the bottom layer serves as the first electrode,
the first insulating layer is provided between the first electrode, and the light emitting layer and the second electrode, and
the one or more effective light-emitting parts are parts in which the light emitting layer and the second electrode are stacked on the first electrode at bottoms of the respective one or more apertures.

10. The display device according to claim 1, wherein the non-light-emission region has light transparency.

11. The display device according to claim 10, wherein each of the plurality of sub-pixels further includes a circuit region, and
the circuit region is provided under the first electrode, to avoid overlap with the non-light-emission region.

12. The display device according to claim 1, wherein the non-light-emission region includes a reflection film.

13. The display device according to claim 1, wherein
each of the one or more apertures is shaped as a truncated cone,
a height H of the first insulating layer, an aperture diameter R1 on lower-end side of the aperture, and an aperture diameter R2 on upper-end side of the aperture satisfy Expression 1 and Expression 2 as follows.

$R1/R2 < 1.0$ (Expression 1)

$0.5 \leq H/R1 \leq 2.0$ (Expression 2)

14. The display device according to claim 1, wherein
the one or more apertures include a plurality of apertures, and
the plurality of apertures differ from one another in a taper angle of the reflector with respect to a lower surface of the first insulating layer.

15. The display device according to claim 1, wherein
the one or more effective light-emitting parts include a plurality of effective light-emitting parts, and
the plurality of effective light-emitting parts differ in planar shapes.

16. The display device according to claim 1, wherein shapes of the one or more effective light-emitting parts are circles or eclipses.

17. The display device according to claim 16, wherein
the one or more effective light-emitting parts include a plurality of effective light-emitting parts, and
the plurality of effective light-emitting parts differ in directions of long axes of the eclipses.

18. The display device according to claim 1, wherein shapes of the one or more effective light-emitting parts are quadrangles.

19. An electronic apparatus, comprising a display device,
the display device including a pixel including a plurality of sub-pixels,
each of the plurality of sub-pixels including:
a light-emission region; and
a non-light-emission region other than the light-emission region, and
the light-emission region including
one or more effective light-emitting parts in which a first electrode, a light emitting layer, and a second electrode are stacked in order, and
a light guide provided on side of the one or more effective light-emitting parts on which light is extracted, wherein the light guide includes:
a first insulating layer that has one or more apertures confronted with the respective one or more effective light-emitting parts, wherein the one or more apertures extend through the light guide; and
a reflector provided on a side surface of each of the one or more apertures.

* * * * *